(12) United States Patent
Wang et al.

(10) Patent No.: US 9,997,562 B1
(45) Date of Patent: Jun. 12, 2018

(54) MRAM MEMORY DEVICE AND MANUFACTURING METHOD THEREOF

(71) Applicant: GLOBALFOUNDRIES Singapore Pte. Ltd., Singapore (SG)

(72) Inventors: Lei Wang, Singapore (SG); Benfu Lin, Singapore (SG); Chim Seng Seet, Singapore (SG); Kai Hung Alex See, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days. days.

(21) Appl. No.: 15/458,944

(22) Filed: Mar. 14, 2017

(51) Int. Cl.
*H01L 21/70* (2006.01)
*H01L 27/22* (2006.01)
*H01L 43/02* (2006.01)
*H01L 43/12* (2006.01)

(52) U.S. Cl.
CPC ............ *H01L 27/222* (2013.01); *H01L 43/02* (2013.01); *H01L 43/12* (2013.01)

(58) Field of Classification Search
CPC ... H01L 21/31053; H01L 43/02; H01L 43/08; H01L 43/12; H01L 27/222
USPC .......................... 438/689, 691, 692; 257/506
See application file for complete search history.

(56) References Cited

U.S. PATENT DOCUMENTS

| 5,688,720 A | * | 11/1997 | Hayashi | ............ H01L 21/31053 257/E21.244 |
| 6,162,368 A | * | 12/2000 | Li | ............................ B24B 37/04 216/38 |
| 6,348,415 B1 | * | 2/2002 | Lee | .................... H01L 21/31053 257/E21.244 |
| 6,573,186 B2 | * | 6/2003 | Park | ..................... H01L 21/7684 257/E21.304 |
| 2015/0171314 A1 | * | 6/2015 | Li | ......................... G11C 11/161 257/421 |
| 2017/0092693 A1 | * | 3/2017 | Tan | ........................ H01L 27/228 |

* cited by examiner

*Primary Examiner* — Brook Kebede
(74) *Attorney, Agent, or Firm* — Horizon IP Pte Ltd.

(57) ABSTRACT

A method of forming a semiconductor device is disclosed. The method includes providing a substrate comprising a circuit component formed on a substrate surface. Back-end-of-line (BEOL) processing is performed to form a plurality of inter-level dielectric (ILD) layers over the substrate. A storage unit in the memory region of the via level of an ILD level. A cell dielectric layer is formed over the storage unit. The cell dielectric layer comprises a step structure created by an elevated topography of the memory region relative to the non-memory region of the via level. The elevated topography is defined by the storage unit. Chemical mechanical polishing (CMP) process is performed on the cell dielectric layer to remove the step structure of the cell dielectric layer and form a planar cell dielectric top surface extending uniformly across the memory region and the non-memory region of the via level.

20 Claims, 17 Drawing Sheets

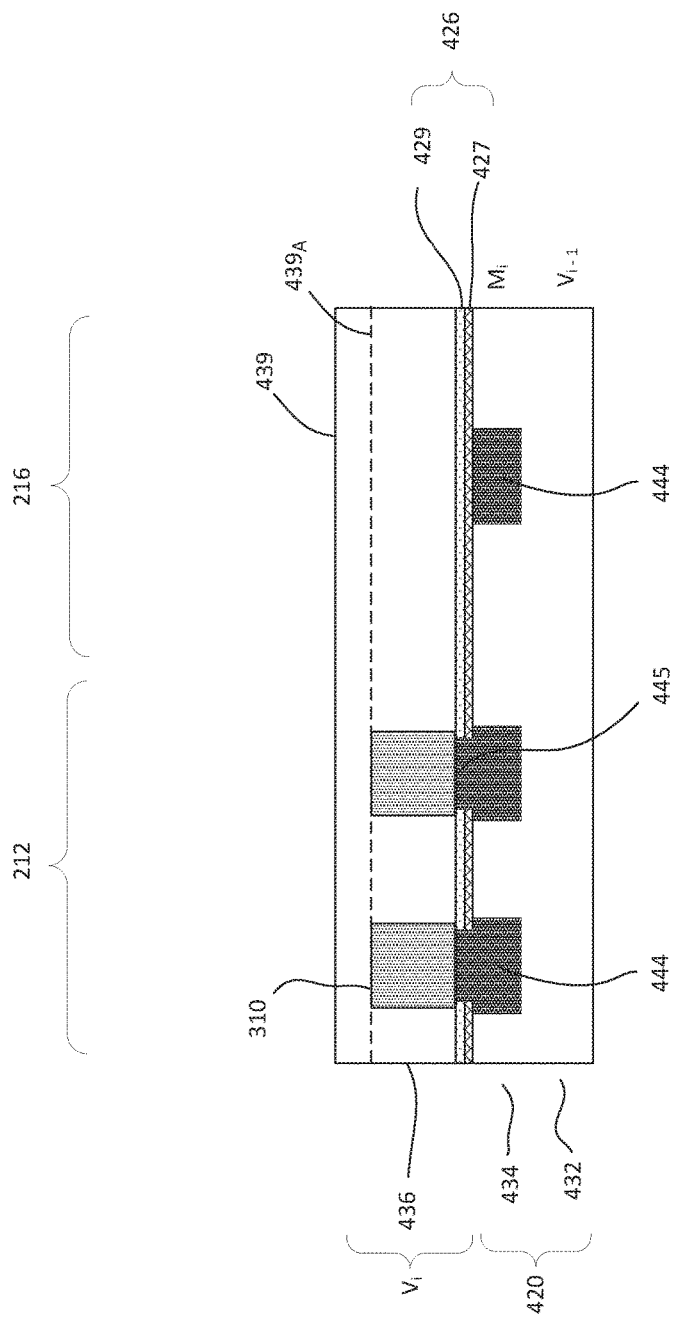

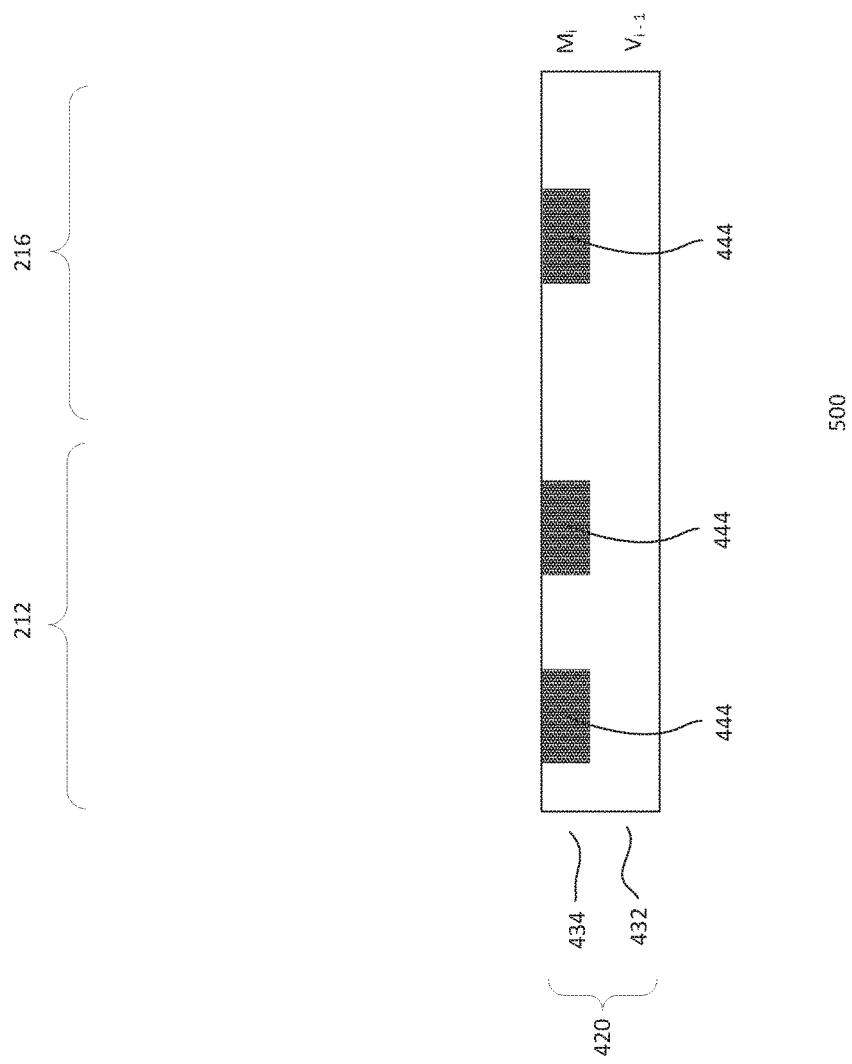

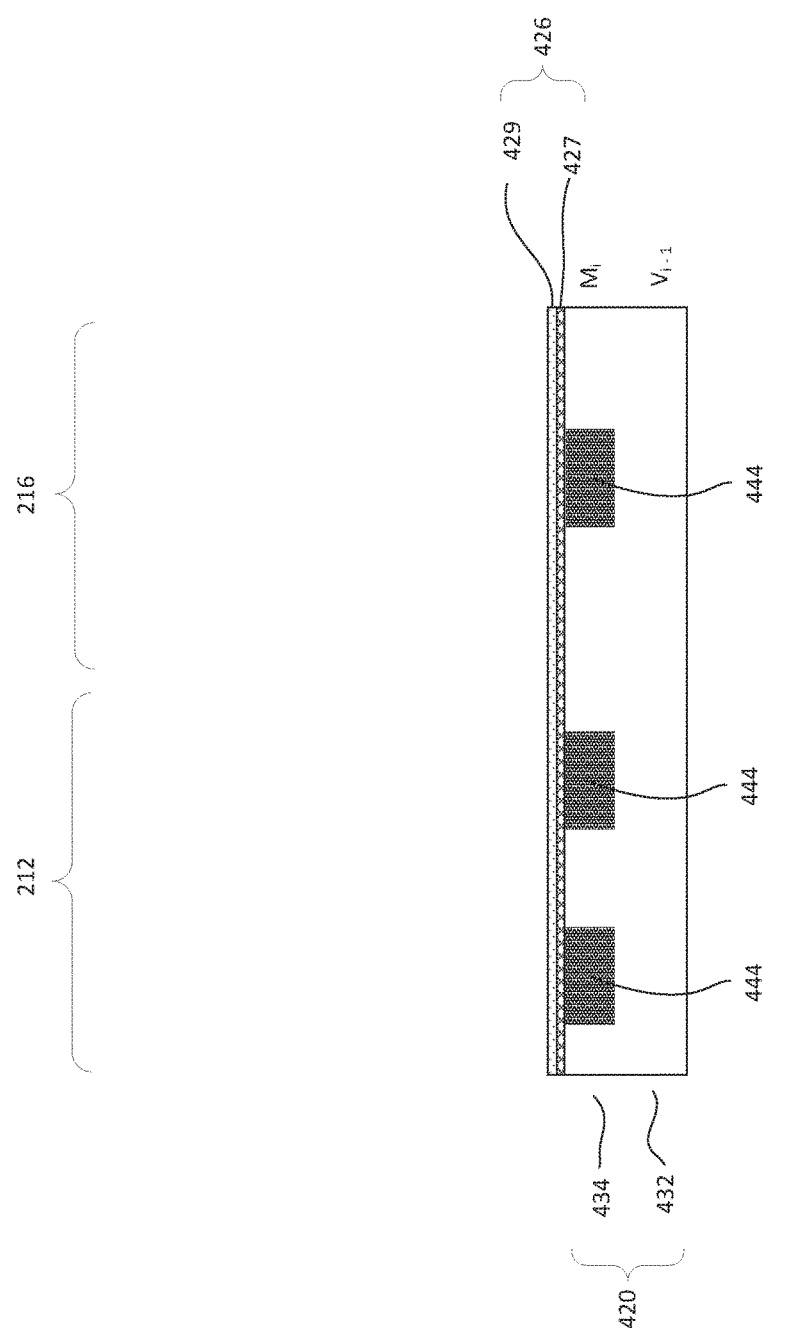

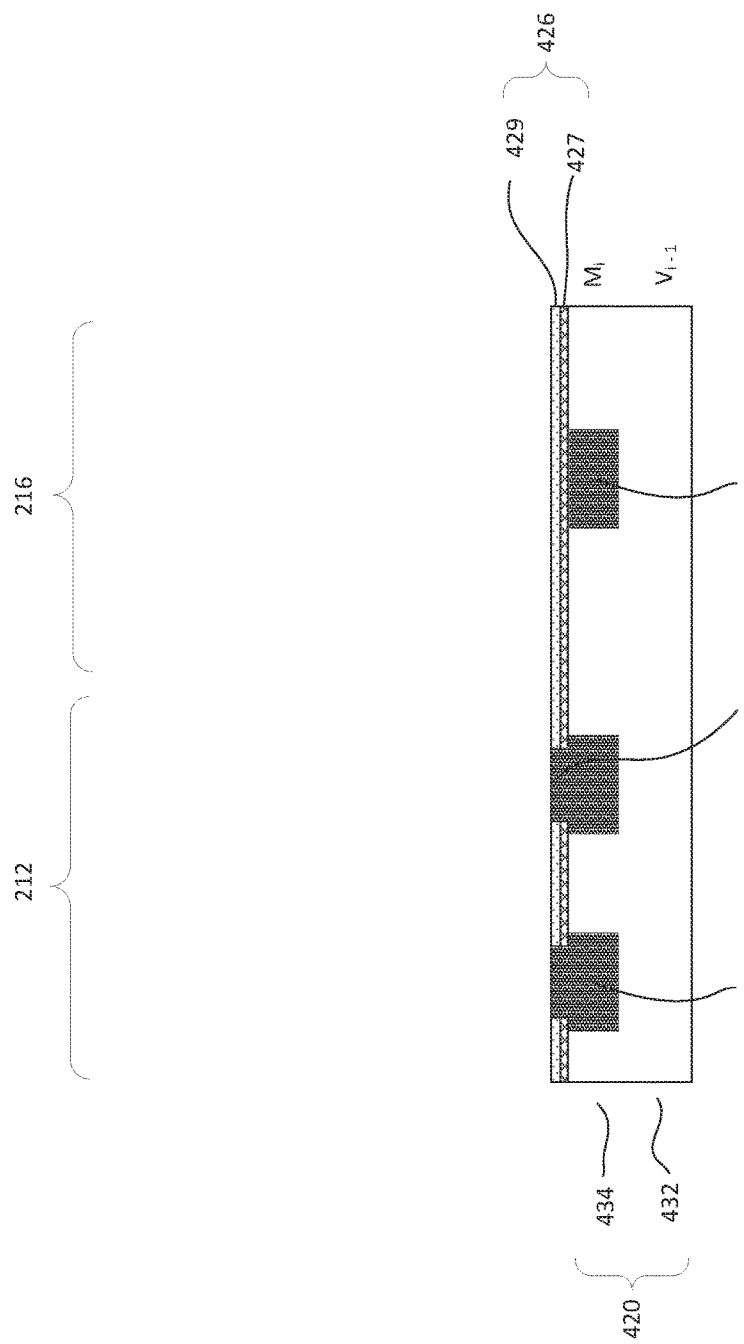

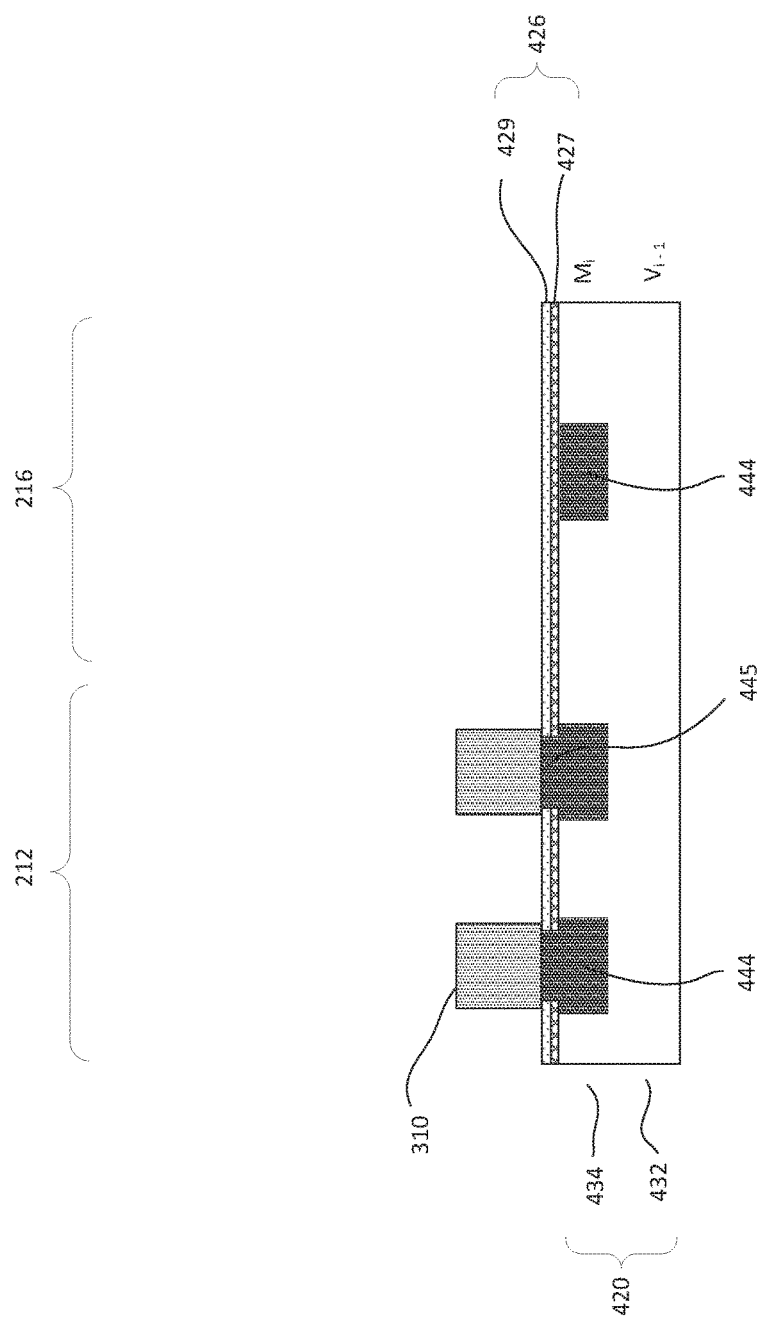

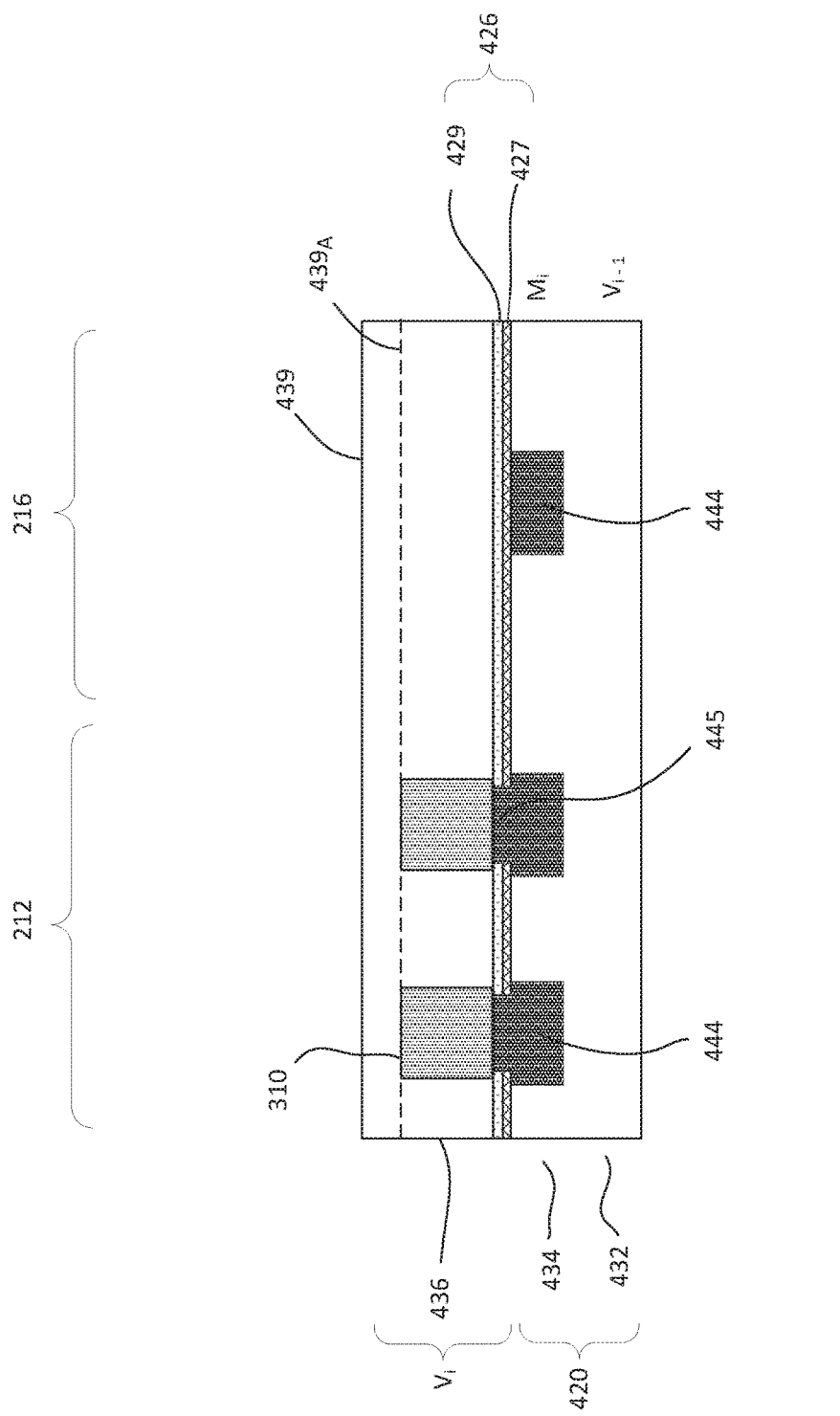

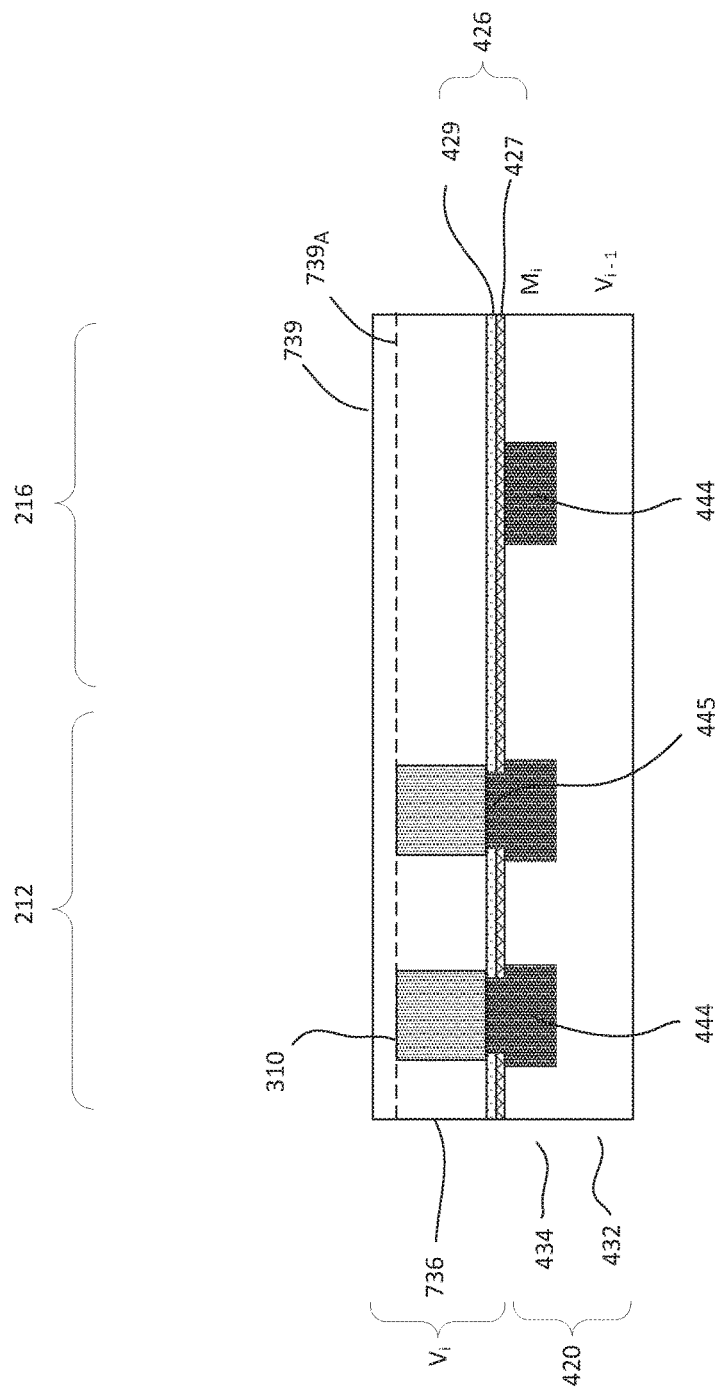

MRAM MEMORY DEVICE AND MANUFACTURING METHOD THEREOF

BACKGROUND

As demands in the semiconductor industry call for further miniaturization and performance enhancement of electronic systems, billions of transistors are now interconnected with tens of kilometers of wires that packed into an area of square centimeters. The complexity of the multi metallization levels of back-end-of-line (BEOL) brings challenges such as the need to reliably process BEOL dielectrics during various processing stages.

During semiconductor fabrication, unwanted surface irregularities can occur across the topological surface of a surface film of a semiconductor wafer. In some cases, large elevation disparities develop between different device regions of a BEOL dielectric layer or level during various processing stages. For example, during the fabrication of integrated circuit (IC) devices having memory regions and non-memory regions, non-volatile memory structures such as magnetoresistive memories may be embedded within multiple inter-level dielectric (ILD) layers. In this instance, the memory structures may be formed in the memory region of an ILD level, thereby resulting in a large step height between the memory region and non-memory region of the ILD level. The difference in surface topology may be transferred to the subsequent BEOL dielectric layer disposed over these regions, which translates to large elevation disparities across the surface topology of the BEOL dielectric layer. If left unattended, such surface irregularities can lead to fabrication defects. This often necessitates the planarization of BEOL dielectrics prior to further processing steps.

Chemical mechanical polishing (CMP) is a process commonly employed to remove surface irregularities of a surface film by removing excess surface material. However, conventional CMP processes are unreliable for planarizing topological surfaces with large elevation disparities due to end-point control limitations. For example, performing a CMP process to remove a large surface elevation in one portion of a BEOL dielectric layer may lead to over-polishing in unelevated portions of the BEOL dielectric layer.

The present disclosure relates to improving control and uniformity of planarization processes across different device regions during fabrication of embedded memory applications.

SUMMARY

Embodiments of the present disclosure generally relate to a device having a memory region and a non-memory region. In one embodiment, a method of forming a device is disclosed. The method includes providing a substrate comprising a circuit component formed on a substrate surface. Back-end-of-line (BEOL) processing is performed to form a plurality of inter-level dielectric (ILD) levels over the substrate. The plurality of ILD levels comprises an $x^{th}$ ILD level. The $x^{th}$ ILD level includes a contact level $V_x$ disposed over a metal level $M_x$. The contact level $V_x$ includes a lower dielectric layer extending across a memory region and a non-memory region of the contact level $V_x$. A storage unit of a memory cell is formed. The storage unit is disposed in the memory region of the contact level $V_x$ and on the lower dielectric layer of the contact level $V_x$. Forming the storage unit includes forming an upper dielectric layer over the lower dielectric layer of the contact level $V_x$. The upper dielectric layer covers the storage unit and extends across the memory region and the non-memory region of the contact level $V_x$. The upper dielectric layer comprises a step structure created by an elevated topography of the memory region relative to the non-memory region of the contact level $V_x$. The elevated topography is defined by the storage unit of the contact level $V_x$. Forming the storage unit further includes performing a chemical mechanical polishing (CMP) process to remove the step structure of the upper dielectric layer. The CMP process forms a planar top surface of the upper dielectric layer. The planar top surface of the upper dielectric layer extends across the memory region and the non-memory region of the contact level $V_x$. The planar top surface of the upper dielectric layer corresponds to a planar top surface of the contact level $V_x$.

In another embodiment, a method of forming a device is disclosed. The method includes providing a substrate comprising a circuit component formed on a substrate surface. Back-end-of-line (BEOL) processing is performed to form a BEOL dielectric stack over the substrate. The BEOL dielectric stack comprises a via level defined with a memory region and a non-memory region. The via level includes a lower dielectric layer extending across the memory and non-memory regions of the via level. A storage unit of a memory cell is formed. The storage unit is disposed in the memory region of the via level and on the lower dielectric layer of the via level. Forming the storage unit includes forming an upper dielectric layer over the lower dielectric layer of the via level. The upper dielectric layer covers the storage unit and extends across the memory region and the non-memory region of the via level. The upper dielectric layer comprises a step structure created by an elevated topography of the memory region relative to the non-memory region of the via level. The elevated topography is defined by the storage unit of the via level. Forming the storage unit further includes performing a chemical mechanical polishing (CMP) process to remove the step structure of the upper dielectric layer. The CMP process forms a planar top surface of the upper dielectric layer. The planar top surface of the upper dielectric layer extends across the memory region and the non-memory region of the via level. The planar top surface of the upper dielectric layer corresponds to a planar top surface of the via level.

In yet another embodiment, a device is disclosed. The device includes a substrate having a circuit component disposed on a substrate surface. A back-end-of-line (BEOL) dielectric stack is disposed on the substrate surface and over the circuit component. The BEOL dielectric stack comprises an interlevel dielectric (ILD) level. The ILD level includes a via level defined with a memory region and a non-memory region. The via level includes a lower via dielectric and an upper via dielectric extending across the memory region and the non-memory region. A storage unit of a memory cell is disposed in the memory region of the via level and on the lower via dielectric. The upper via dielectric is a single and distinct dielectric layer which covers first and second sides of the storage unit. The upper via dielectric also includes a chemical mechanical polished top surface which extends uniformly throughout the upper via dielectric. The chemical mechanical polished top surface of the upper via dielectric corresponds to a planar top surface of the via level.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIG. 4 shows a simplified embodiment of BEOL with magnetic memory stacks; and

FIGS. 5a-5d show simplified cross-sectional views of an embodiment of a process for forming memory cells of a device;

FIGS. 6a-6f show simplified cross-sectional views of an embodiment of a process for forming a device; and FIGS. 7a-7c show simplified cross-sectional views of another embodiment of a process for forming a device.

DETAILED DESCRIPTION

Embodiments generally relate to devices, for example, semiconductor devices or integrated circuits (ICs). More particularly, embodiments relate to forming embedded memory in BEOL dielectrics of an IC. The ICs can be any type of ICs with embedded memory, such as signal processors, microcontrollers or system-on-chip (SoC) ICs. Other types of ICs or devices may also be useful. The devices or ICs can be incorporated into or used with, for example, consumer electronic products, or other types of products.

The fabrication of devices may involve the formation of features on a substrate that make up circuit components, such as transistors, resistors and capacitors. The devices are interconnected, enabling the ICs to perform the desired functions. To form the features and interconnections, layers are repeatedly deposited on the substrate and patterned as desired using lithographic techniques. For example, a wafer is patterned by exposing a photoresist layer with the pattern on a reticle with an exposure source. After exposure, the photoresist layer is developed, where the pattern of the reticle is transferred to the photoresist, and a photoresist etch mask is created. An etch is performed using the etch mask to replicate the pattern on the wafer below, which may include one or more layers, depending on the stage of the process. In the formation of an IC, numerous reticles may be used for different patterning processes. Furthermore, a plurality of ICs may be formed on the wafer in parallel.

Figure 1:
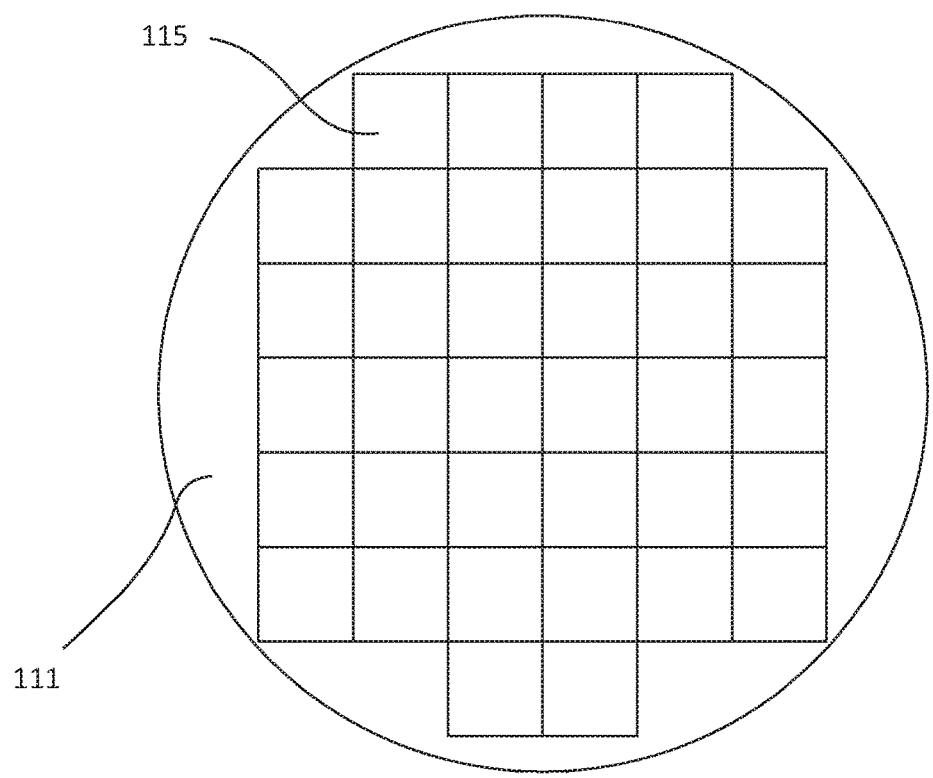
FIG. 1 shows a top view of a semiconductor wafer.

FIG. 1 shows a simplified plan view of an embodiment of a semiconductor wafer 101. The semiconductor wafer, for example, may be a silicon wafer. The wafer may be a lightly doped p-type wafer. Other types of wafers, such as silicon-on-insulator (SOI), or silicon germanium wafer as well as doped wafers with other types of dopants or dopant concentrations may also be useful.

The wafer includes an active surface 111 on which devices 115 are formed. A plurality of devices may be formed on the wafer in parallel. The devices, for example, are arranged in rows along a first (x) direction and columns along a second (y) direction. Wafer dicing process is then performed. When the process is completed, the wafer is diced along the dicing channels to singulate the devices into individual chips.

Figure 2:
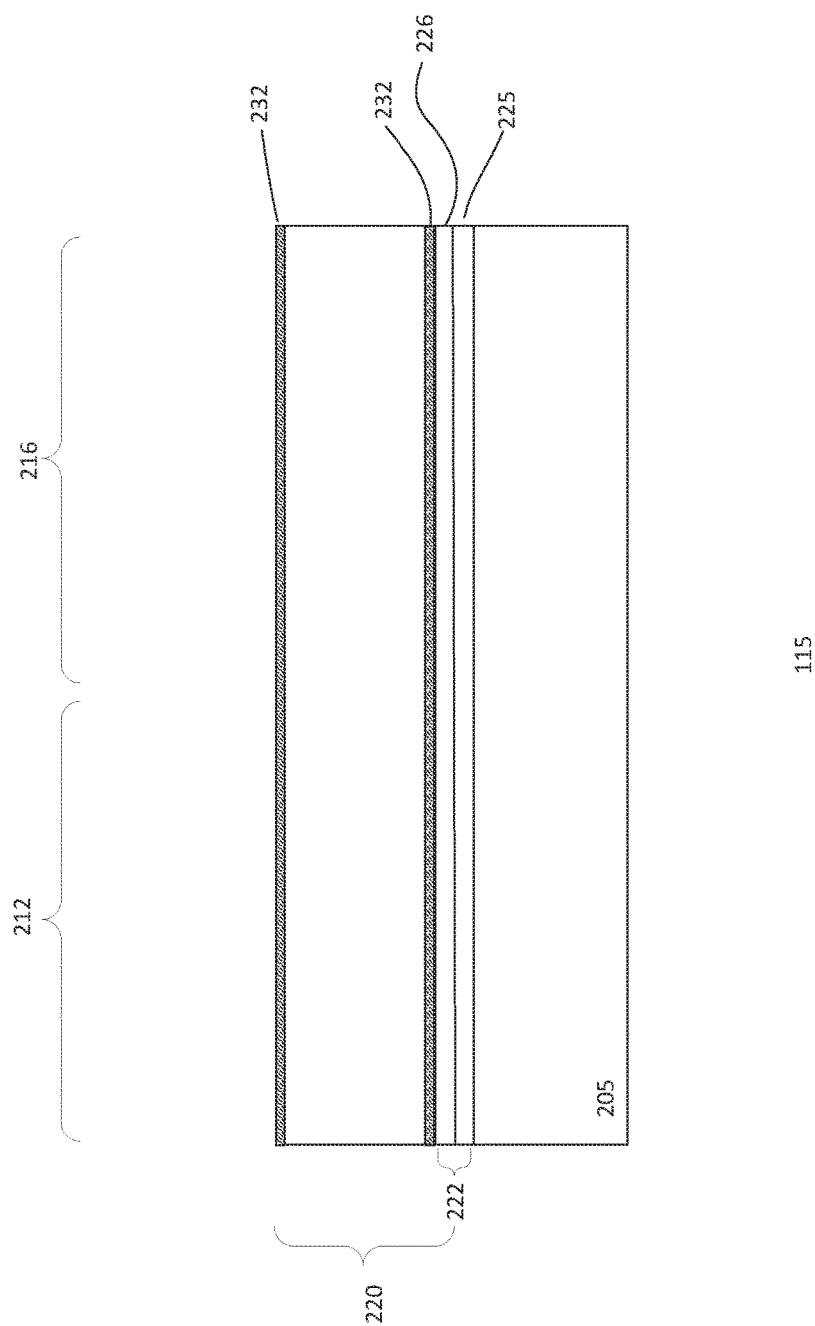
FIG. 2 shows a simplified cross-sectional view of an embodiment of a device.

FIG. 2 shows a simplified embodiment of a device 115. The device, for example, is an integrated circuit (IC). Other types of devices may also be useful. The device, for example, may be formed in parallel on a wafer and subsequently be singulated. The device includes a substrate 205. The device, for example, may be a part of the wafer, as described in FIG. 1. Common elements may not be described or described in detail. The substrate, for example, may be a semiconductor substrate, such as a silicon substrate. Other types of substrates or wafers may also be useful.

The substrate of the device, as shown, includes first and second device regions 212 and 216. In one embodiment, the first region is a memory region and the second region is a non-memory region. The memory region 212, for example, includes one or more embedded memory cell. For example, the memory region includes a plurality of embedded memory cells. The plurality of memory cells may be interconnected to form a memory array. A memory cell may include a cell select unit and a storage unit. In one embodiment, the storage units of the memory cells are disposed within back-end-of-line (BEOL) dielectrics (or dielectric stack) 220 while select units, such as select transistors, may be disposed on the substrate 205. BEOL dielectrics 220, for example, include a plurality of BEOL dielectric layers. As for the non-memory region 216, it may include a logic region on which logic circuitry or devices are formed. The logic region 216, in one embodiment, includes sub-regions. The sub-regions, for example, include logic components. The logic components, for example, are metal oxide semiconductor (MOS) transistors. Other types of components or device regions may also be useful. Although, the substrate is illustrated as having one memory region and one logic region, it is understood that the substrate may also include other numbers of regions or sub-regions.

Front-end-of-line (FEOL) processing is performed on the substrate. For example, isolation regions are formed to isolate different device regions. The isolation regions, for example, are shallow trench isolation (STI) regions. Other types of isolation regions may also be useful. The isolation regions are provided to isolate device regions from other regions. Device wells are formed for p-type and n-type transistors for a complementary MOS (CMOS) device. Separate implants may be employed to form different doped regions of the transistors using, for example, implant masks, such as photoresist masks. Gates of transistors are formed on the substrate. Gates are formed by, for example, a gate dielectric layer, such as thermal silicon oxide layer, followed by a gate electrode layer, such as polysilicon. The gate electrode may be doped to improve electrical conductance. Providing an undoped gate electrode or other types of gate materials may also be useful. The gate dielectrics of different transistors may be formed by the same process. For example, a select transistor in the memory region may have same or similar gate dielectric thicknesses to logic transistors in the non-memory region. Other suitable gate dielectric thickness configurations may also be useful. For example, depending on design requirements, separate processes may also be employed to form transistors with different gate dielectric thicknesses.

After forming transistors, back-end-of-line (BEOL) processing is performed. The BEOL process includes forming interconnects in inter-level dielectric (ILD) layers of a BEOL dielectric stack 220. For example, the BEOL dielectric stack includes one or more ILD layers 222 in which interconnects are formed. The interconnects connect the various components of the IC to perform the desired functions. An ILD layer includes a metal level 226 disposed over a contact level 225. Generally, the metal level includes conductors or metal lines while the contact level includes contacts. The conductors and contacts may be formed of metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene techniques. This results in the conductors and contacts having the same material. In some cases, the conductors and contacts may have different materials. Forming the upper metal levels using single damascene techniques may also be useful. For example, in the case where the contacts and conductors are formed by single damascene techniques, the materials of the conductors and contacts may be different. Other techniques, such as reactive ion etch (RIE) may also be employed to form metal lines.

A device may include a plurality of ILD layers or levels 222. In one embodiment, x number of ILD levels may be provided in the BEOL dielectric stack. For example, 5 ILD levels (x=5) may be provided for the device. Other numbers of ILD levels may also be useful. The number of ILD levels may depend on, for example, design requirements or the logic processes involved. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels.

In one embodiment, a first contact level or layer 225 is formed on the substrate 205. The first contact level may be a dielectric layer formed over the transistors. For example, the dielectric layer may be silicon oxide or low-k dielectric, such as carbon-doped silicon oxide (SiCOH), formed by chemical vapor deposition (CVD). The dielectric layer serves as a pre-metal dielectric (PMD) layer that isolates BEOL metal levels from the substrate 205 and the transistors on the substrate. The first contact level 225 may be referred to as CA level. Contacts are formed in the CA level dielectric layer. The contacts may be vias formed by single damascene techniques. Via openings are formed in the dielectric layer using mask and etch techniques. For example, a pattern resist mask with openings corresponding to the vias is formed over the dielectric layer. An anisotropic etch, such as RIE, is performed to form the vias, exposing underlying transistor contact regions, such as S/D regions and gates. A conductive layer, such as tungsten is deposited on the substrate, filling the openings. The conductive layer may be formed by sputtering. Other techniques may also be useful. A planarization process, such as chemical mechanical planarization (CMP), is performed to remove excess conductive materials, leaving contact plugs in the CA level. The first contact level or CA level, for example, interconnects components formed by FEOL processes to metal levels formed by BEOL processes.

After forming contacts in the CA level, the BEOL process commences by forming another dielectric layer 226 over the substrate, covering the CA level dielectric layer 225. The dielectric layer 226, for example, serves as the first metal level $M_1$ of the first ILD layer. The dielectric layer, in one embodiment, may be a silicon oxide based material. For example, the first ILD layer is a tetraethyl orthosilicate (TEOS) ILD layer. Other types of dielectric layers may also be useful. The dielectric layer may be formed by CVD. Other techniques for forming the dielectric layer may also be useful.

Conductive lines are formed in the $M_1$ level dielectric layer. The $M_1$ conductive lines may be formed by single damascene techniques. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. The first metal level $M_1$ and CA level may be referred as a lower ILD level.

The BEOL process continues to form additional ILD layers of the BEOL dielectric stack 220. For example, the process continues to form upper ILD levels (not shown). The upper ILD levels may include ILD level 2 to ILD level x. For example, in the case where x=5 (5 levels), the upper levels include ILD levels from 2 to 5, which includes $M_2$ to $M_5$. The number of ILD layers depends on, for example, design requirements or the logic process involved. These ILD layers may be referred to as intermediate ILD layers. The intermediate ILD layers may be formed of silicon oxide based material. For example, the ILD layers may be formed from tetraethyl orthosilicate (TEOS). Other types of dielectric materials, such as low-k, high-k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structures may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed, forming conductors and contacts in the intermediate ILD layer. In other embodiments, the upper ILD layers may be formed by single damascene techniques. For example, in single damascene techniques, separate etch and fill processes are employed for the vias and metal levels. Forming the upper ILD layers using a combination of single and dual damascene techniques may also be useful. For example, one or more upper levels may be formed by single damascene techniques while others are formed by dual damascene techniques.

A dielectric liner 232 may be disposed between ILD levels, and on the substrate. In some embodiments, a dielectric liner (not shown) may be disposed between a metal and a via level. The dielectric liner, for example, serves as an etch stop layer. The thickness of the dielectric liners may be about 300 Å. Other thicknesses may also be useful. The dielectric liners may be formed of a low-k dielectric material. For example, the dielectric liners may be NBLoK (nitrogen doped silicon carbide). Other types of dielectric materials for the dielectric liners may also be useful. It is understood that different dielectric liners need not to be formed of the same material. In one embodiment, a dielectric liner 232 may also be disposed over the BEOL dielectric stack 220. The dielectric liner, for example, serves to provide an etch stop layer over an uppermost ILD level. In some embodiments, the surface of an ILD layer is processed prior to forming additional ILD layers. This may result in the deposition of residual metal material on the processed ILD layer. In such case, the dielectric liner 232 may also serve as a protective capping layer between ILD levels or layers to avoid or reduce the formation of dendrites from the residual metal material on the underlying ILD layer.

The uppermost ILD level (e.g., x) may have different design rules, such as critical dimension (CD), than the lower ILD levels. For example, the top metal level $M_x$ may have a larger CD than the lower metal levels $M_1$ to $M_{x-1}$. For example, the uppermost or top metal level may have a CD which may be greater than 6× compared to the lower levels. The lower levels may be 1×, 2× or 6×. Other configurations of the lower levels may also be useful.

In one embodiment, a pad level (not shown) may be provided over the uppermost ILD level. In the case where a dielectric liner lines the top of the uppermost ILD level, the pad level may be provided over the dielectric liner. The pad level, for example, includes a pad metal level disposed over a pad via level. The pad metal level includes pad interconnects. The pad metal level may be an ultra-thick metal (UTM) level. For example, the pad interconnects are UTM pad interconnects. The UTM metal level may be much thicker than other metal levels. The pad interconnects and pad via contacts may be formed of copper or copper alloy. Other types of conductive materials and other processes may be employed to form the pad interconnects and via contacts.

A passivation layer (not shown) is disposed over the pad level. The passivation layer, for example serves to protect the device from cracking, oxidation, moisture as well as downstream processes. In some embodiments, the passivation layer may include a plurality of passivation layers. Other configurations of passivation layer may also be useful. Pad openings are provided to expose the pad interconnects. The pad interconnects provide external connections to the device.

Figure 3:
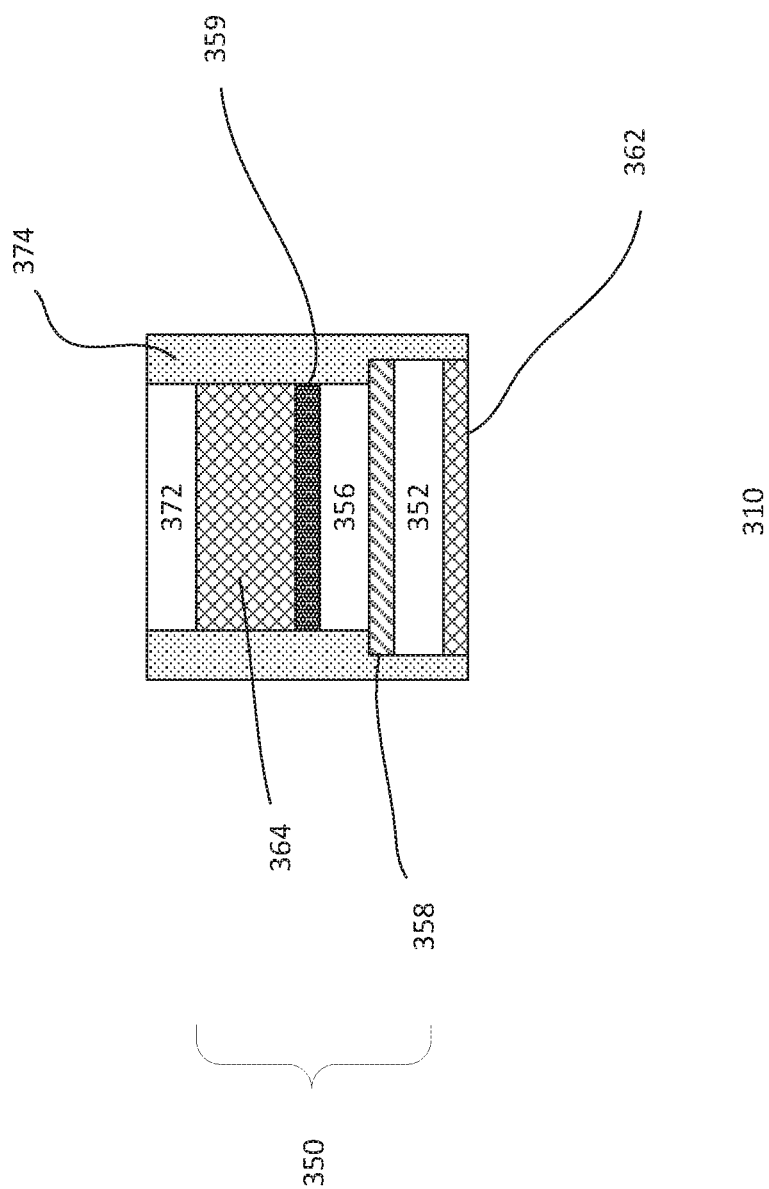
FIG. 3 shows an embodiment of a storage unit of a memory cell.

FIG. 3 shows a cross-sectional view of an embodiment of a storage unit 310 of a memory cell. The storage unit, in one embodiment, is a magnetoresistive storage unit for a magnetoresistive random access memory (MRAM) cell. Other types of storage units may also be useful. As shown, the storage unit includes a magnetic tunnel junction (MTJ) module 350 disposed between bottom and top electrodes 362 and 364. The bottom electrode 362 is proximate to the substrate on which the memory cell is formed while the top electrode 364 is distal from the substrate.

The MTJ module includes first and second magnetic layers 352 and 356 separated by a tunneling barrier layer 358. One of the magnetic layers is a fixed magnetic layer while the other magnetic layer is a free magnetic layer. For example, the magnetization of the fixed magnetic layer is fixed in a first direction while the magnetization of the free magnetic layer may be programmed to be in the first or same direction as the fixed layer, or in a second or opposite direction as the fixed layer.

For example, in the case that the magnetic orientation or magnetization of the free layer is programmed to be in the second or anti-parallel direction to the fixed layer, the corresponding MTJ electrical resistance between the free layer and the fixed layer may be denoted as $R_{AP}$. In the case that the magnetic orientation of the free layer is programmed to be in the first or parallel direction as the fixed layer, the corresponding MTJ electrical resistance between the free layer and the fixed layer may be denoted as $R_P$. The resistance $R_{AP}$ is higher than the resistance $R_P$.

In one embodiment, the first and second directions may be in the perpendicular direction, forming a perpendicular MTJ (pMTJ) module. The perpendicular direction, for example, is the direction perpendicular to the direction of the substrate surface. The first perpendicular direction may be downwards toward the substrate surface while the second opposite perpendicular direction may be upwards away from the substrate surface. In another embodiment, the first and second directions may be in the horizontal direction, forming a horizontal MTJ (hMTJ) module. The horizontal direction, for example, may be the direction parallel to the direction of the substrate surface. The first may be to the right while the second opposite direction may be to the left. Other configurations of horizontal and perpendicular directions may also be useful.

The MTJ module 350 may be configured as a bottom pinned pMTJ or hMTJ module. In a bottom pinned MTJ module, the fixed magnetic layer is disposed below the free magnetic layer. Alternatively, the MTJ module may be configured as a top pinned pMTJ or hMTJ module. In a top pinned MTJ module, the fixed magnetic layer is disposed above the free magnetic layer.

As shown, the MTJ module 350 includes a capping layer 359 provided over the second magnetic layer 356. For example, the capping layer is disposed between the top electrode 364 and second magnetic layer 356. The capping layer serves to protect the underlying magnetic layer. The capping layer 359 may be Platinum (Pt), Ruthenium (Ru), Tantalum (Ta) or other suitable metals. It is appreciated that in some instances, the capping layer material may also improve the performance of the MTJ module. A dielectric hard mask layer 372 may be disposed over the top electrode. The hard mask, for example, may be silicon oxide (SiO). Other types of dielectric hard mask materials may also be useful.

A dielectric encapsulation 374 surrounds the storage unit 310. The dielectric encapsulation, in one embodiment, may be a different dielectric material from the hard mask 372. For example, the dielectric encapsulation is silicon nitride (SiN). Other types of dielectric encapsulations may also be useful. The dielectric encapsulation may be formed by, for example, CVD. The encapsulation may serve to protect the MTJ module.

The MTJ module 350, as described, is a simplified description. In actuality, the MTJ module may include other layers. For example, the MTJ module may include seed and/or wetting layers to form the magnetic layers 352 and 356. In addition, the magnetic layers may include multiple magnetic layers. For example, the free magnetic layer may be a mono-coupling stack or a multiple coupling stack having a plurality of mono-coupling stacks separated by coupling layers. A coupling stack includes a coupling layer between two magnetic layers. As for the fixed magnetic layer may include a pinning layer and a reference layer. The pinning layer serves as a hard magnet for fixing the magnetization of the reference layer.

As an example, the magnetic layers may be Cobalt-Iron-Boron (CoFeB) or Cobalt-Iron (CoFe) based composite materials, the tunneling barrier and coupling layers may be Magnesium Oxide (MgO) or Aluminum Oxide ($Al_2O_3$), the pinning layer may be Platinum-Manganese (PtMn), Iridium-Manganese (IrMn) or multilayers of Cobalt/Platinum (Co/Pt), Cobalt/Nickel (Co/Ni), the top and bottom electrodes may be Tantalum Nitride (TaN) or Tantalum (Ta). Other suitable materials for the MTJ module may also be useful. The MTJ stack may include other layers as well. Other suitable configurations of MTJ may also be useful. A description of MTJ elements may be found in, for example,

*Materials Today Journal*, Volume 9, Issue 11, pages 36-45 (November 2006), which is herein incorporated by reference for all purposes.

As shown, the upper portion of the storage unit 310, which includes the second magnetic layer 356 and layers above, is smaller than the lower portion of the storage unit, which includes the tunneling barrier layer 358 and layers below. For example, the upper and lower portions are formed using separate anisotropic etch processes, such as reactive ion etch (RIE) processes. In one embodiment, the layers of the lower portion are formed and patterned using a hard mask. A sacrificial dielectric layer is formed on the substrate and is planarized to remove excess dielectric materials, forming a planar top surface between the sacrificial dielectric layer and lower portion of the storage unit. Subsequently, layers of the upper portion of the storage unit are formed and patterned using a hard mask. The sacrificial dielectric layer is removed after defining the upper portion of the storage unit, leaving the storage unit 310 as shown. A dielectric encapsulation is formed to surround the storage unit. Other techniques or processes may also be used to form the storage unit 310.

FIG. 4 shows a cross-sectional view of a simplified embodiment of a device 400. As shown, the device depicts an $i^{th}$ ILD level 420 of a BEOL dielectric stack having x ILD levels. For example, the BEOL processing forms x ILD levels. An ILD level includes a via level 432 disposed below a metal level 434. For example, the $i^{th}$ ILD level includes metal level $M_i$ disposed over via level $V_{i-1}$. The $i^{th}$ metal level $M_i$ includes metal lines 444 while the via level $V_{i-1}$ includes via contacts (not shown) coupled to the $M_i$ metal lines. The $i^{th}$ ILD level may be any ILD level of the BEOL dielectric stack, where i is from 1 to x−1. For example, the $i^{th}$ ILD level may be any metal level below the top ILD level (e.g., i<x). The $i^{th}$ ILD level, for example, may be x−1 ILD level. Other $i^{th}$ ILD levels, where i<x, may also be useful. In one embodiment, the ILD levels of the device are formed of silicon oxide based material. For example, the ILD levels may be formed of tetraethyl orthosilicate (TEOS). Other types of dielectric materials may also be useful.

It is understood that the device includes a substrate (not shown) prepared with components from FEOL processing, as described with respect to FIG. 2. Common elements may not be described or described in detail. The substrate, for example, may be a semiconductor substrate, such as a silicon substrate. Other types of substrates or wafers may also be useful.

The device, as shown, includes first and second device regions 212 and 216. In one embodiment, the first region is a memory region and the second region is a non-memory region. The memory region 212, for example, includes a plurality of embedded memory cells. For example, the memory region includes an array of memory cells. A memory cell may include a cell select unit and a storage unit 310. In one embodiment, the storage unit of the memory cells is disposed within a BEOL dielectric layer 436 while the select unit, such as a transistor, may be disposed on the substrate. The select units may be formed on the substrate by FEOL processing. As for the non-memory region 216, it may include numerous sub-regions. For example, the various sub-regions may include high voltage (HV), low voltage (LV) and intermediate or medium voltage (MV) regions. High voltage devices or components are formed in the high voltage region, low voltage components are formed in the low voltage region and intermediate voltage components are formed in the intermediate voltage region. The components, for example, are metal oxide semiconductor (MOS) transistors formed on the substrate by FEOL processing. Other types of components or device regions may also be useful.

A cap layer 427, in one embodiment, is disposed over $M_i$. The cap layer, for example, serves as an etch stop layer as well as a protective layer for the $M_{i-1}$ layer. The cap layer may be a dielectric layer. In one embodiment, the cap layer is a low-k dielectric layer. For example, the cap layer may be a SiCNH layer, such as NBLoK. A via dielectric layer 429 is disposed over the cap layer. The via dielectric layer, for example, is a silicon oxide layer. Other types of via dielectric layers may also be useful. The via dielectric layer 429 and cap layer 427, for example, may be collectively referred to as a lower cell via layer or level 426.

In one embodiment, a cell dielectric layer 436 is disposed over the $i^{th}$ ILD level. For example, the cell dielectric layer is disposed over the lower cell via level 426. The cell dielectric layer, in one embodiment, is formed from a suitable BEOL dielectric material. For example, the dielectric layer may be formed of TEOS. Other types of dielectric material may also be useful. The cell dielectric layer 436 may be referred to as an upper cell via level. The upper cell via level 436 and lower cell via level 426 collectively form the cell via level. The cell via level, for example, may be the via level of the i+1 ILD level. For example, the cell via level is $V_i$ level of the i+1 ILD level.

The cell dielectric layer 436 includes storage units 310 disposed in the memory region 212. The storage units, for example, are magnetoresistive storage units of MRAM cells. The storage units, for example, include storage units such as those described in FIG. 3. In the interest of brevity, the storage units 310 will not be described in detail. A storage unit, for example, includes a MTJ module disposed between bottom and top electrodes. Other types of storage units may also be useful. As shown, openings in the lower cell via dielectric level 426 include storage unit contacts 445 which are directly coupled to the storage units 310. For example, the storage unit contacts couple the bottom electrodes of the storage units 310 to the $M_i$ metal lines 444. The storage unit contacts 445, for example, may be metal storage unit contacts, such as copper or copper alloy. The storage unit contacts 445 may be the same material as the metal lines 444. Other types of storage unit contacts may also be useful.

In one embodiment, the cell dielectric layer 436 includes a planar top surface 439. The planar top surface, for example, is a polished top surface. The polished top surface, for example, may be a chemical mechanical polished (CMP) top surface. In one embodiment, the cell dielectric layer 436 includes a thickness that is same as or more than the thickness of the storage units 310. For example, the cell dielectric layer may be processed to form a planar top surface 439 that is positioned above the storage units 310. Alternatively, the top surface of the cell dielectric layer 439 may be processed to form a top surface $439_A$ that is coplanar with the top of the storage units 310. In one embodiment, a height of the storage unit 310 is about 1000 Å and an overall thickness of the cell dielectric layer is about 1000-2000 Å. For example, the cell dielectric layer includes a thickness of about 0-1000 Å over the storage units. Other configurations of cell dielectric layer and storage units may also be useful.

A metal level (not shown) may be disposed over $V_i$. For example, $M_{i+1}$ may be disposed over $V_i$. Depending on design requirements, additional ILD levels as well as UTM level and passivation layer may be provided over $M_{i+1}$. Other device layers may also be provided.

FIGS. 5a-5d show cross-sectional views of an embodiment of a process 500 for forming memory cells of a device. The memory cells may be similar to that described in FIG.

3 while the device may be similar to that described in FIG. 4. For example, the process 500 relates to forming storage units of the memory cells in an ILD level of the device. In the interest of brevity, common elements and features having the same reference numerals may not be described or described in detail. The device, for example, includes a substrate (not shown) which includes FEOL components. The device includes first and second regions 212 and 216. In one embodiment, the first region is a memory region and the second region is a non-memory region. For example, the first region 212 includes embedded memory cells and the second region 216 includes logic devices.

Referring to FIG. 5a, BEOL processing is performed after forming FEOL components on the substrate. The BEOL process includes forming interconnect structures and memory cells in ILD levels of the device. An ILD level 420 is shown in FIG. 5a. In one embodiment, the ILD level 420 is formed below an uppermost (or top) ILD level. For example, the ILD level 420 may be an intermediate ILD level or lower ILD level. The ILD level, for example, is the $i^{th}$ ILD level. The ILD level 420 includes a via level 432 disposed below a metal level 434. Metal lines 444 are disposed in the metal level while via contacts (not shown) are disposed in the via level 432. For example, the $i^{th}$ ILD level includes metal level $M_i$ over via level $V_{i-1}$. The metal lines and via contacts may be copper or copper alloy and formed by dual damascene techniques. Other types of metal lines and via contacts or other forming techniques may also be useful. The value of i may depend on design requirements. Depending on the desired value of i, the device may include one or more lower ILD levels (not shown) below the ILD level 420. For example, the device may include 1 to i–1 ILD levels.

Referring to FIG. 5b, a lower cell via layer 426 is formed over the metal level $M_i$. In one embodiment, the lower cell via layer includes a cap layer 427 directly over $M_i$ and a via dielectric layer 429 thereover. The cap layer, for example, serves as an etch stop layer as well as a protective layer for $M_i$. In one embodiment, the cap layer is a low-k dielectric layer. For example, the cap layer may be a SiCNH layer, such as NBLoK. As for the via dielectric layer 429, it may be a silicon oxide layer. Other types of via dielectric layers may also be useful. The thickness of the lower cell via layer may be about 60 nm. Other thicknesses may also be useful.

Referring to FIG. 5c, the lower cell via layer 426 is patterned to form openings corresponding to locations where storage unit contacts 445 are to be formed. Patterning the lower cell via layer may be achieved using mask and etch techniques. For example, a soft mask, such as photoresist may be formed over the via dielectric layer 429. An exposure source may selectively expose the photoresist layer through a reticle containing the desired pattern. After selectively exposing the photoresist layer, it is developed to remove portions of the via dielectric layer 429 and cap layer 427 to expose the metal lines 444 in the memory region 212. To improve lithographic resolution, an anti-reflective coating (ARC) may be used below the photoresist layer. The patterned mask layer is used to pattern the lower cell via layer 426. For example, an anisotropic etch, such as reactive ion etch (RIE), is used to remove exposed portions of dielectric material of the lower cell via layer 426. Other types of etch processes may also be useful. The etch transfers the pattern of the mask layer to the underlying lower cell via layer. For example, the pattern of the mask layer is transferred to the via dielectric layer and cap layer.

A conductive layer is formed over the lower cell via layer 426. For example, the conductive layer fills the openings and covers the via dielectric layer 429. In one embodiment, the conductive layer is formed of the same material as the metal lines 444. For example, the conductive layer is copper or a copper alloy. The conductive layer may be formed by plating, such as electro plating. Other types of conductive layer or forming techniques may also be useful. Excess conductive material is removed to form the storage unit contacts 445, as shown. In one embodiment, a planarization process is performed to remove the excess conductive material over the lower cell via layer 426. For example, conductive material remains within the openings of the lower cell via layer 426 to form storage unit contacts 445. Planarizing the conductive layer, in one embodiment, includes polishing the substrate surface. For example, chemical mechanical polishing (CMP) is employed to planarize the conductive layer. Other planarizing techniques may also be useful. Planarizing the conductive layer provides the storage unit contacts 445 and the via dielectric layer 429 with coplanar top surfaces.

Referring to FIG. 5d, the process continues to form storage units 310. For example, storage units are formed on the lower cell via layer 426 in the memory region 212 of the device. The storage units, for example, are magnetoresistive storage units of MRAM cells. The storage units, for example, include storage units such as those described in FIG. 3. In the interest of brevity, the storage units are not shown or described in detail. A storage unit, for example, includes a MTJ module disposed between bottom and top electrodes. Other types of storage units may also be useful. For example, the storage unit may include other types of magnetoresistive storage units as well as non-magneto resistive storage units.

The bottom electrodes of the storage units 310, as shown, are coupled to the storage unit contacts 445 in the memory region 212. The storage units 310 may be formed as described in FIG. 3. Alternatively, other types of storage units or process for forming the storage units may also be useful. Although only two storage units are shown, it is understood that there are many more storage units. Furthermore, the space between storage units may be different. For example, some are narrower while others are wider. The different widths depend on, for example, layout of the storage units.

FIGS. 6a-6e show cross-sectional views of an embodiment of a process 600 for forming a device. The process 600 relates to forming an ILD level of a device. The device may be similar to that described in FIG. 4. For example, the process 600 relates to forming an upper cell via level 436, as shown in FIG. 4. In the interest of brevity, common elements and features having same reference numerals and common processes may not be described or described in detail. The device, for example, includes a substrate (not shown) which includes FEOL components. The device includes first and second regions 212 and 216. In one embodiment, the first region is a memory region and the second region is a non-memory region. For example, the memory region 212 includes embedded memory cells and the non-memory region 216 includes logic devices. BEOL processing is performed after forming FEOL components on the substrate. The BEOL processing may include processes same as or similar to the process 500 as described in FIGS. 5a-5d. The BEOL processing, for example, includes processes to form interconnects and memory cells in ILD levels.

Figure 6A:
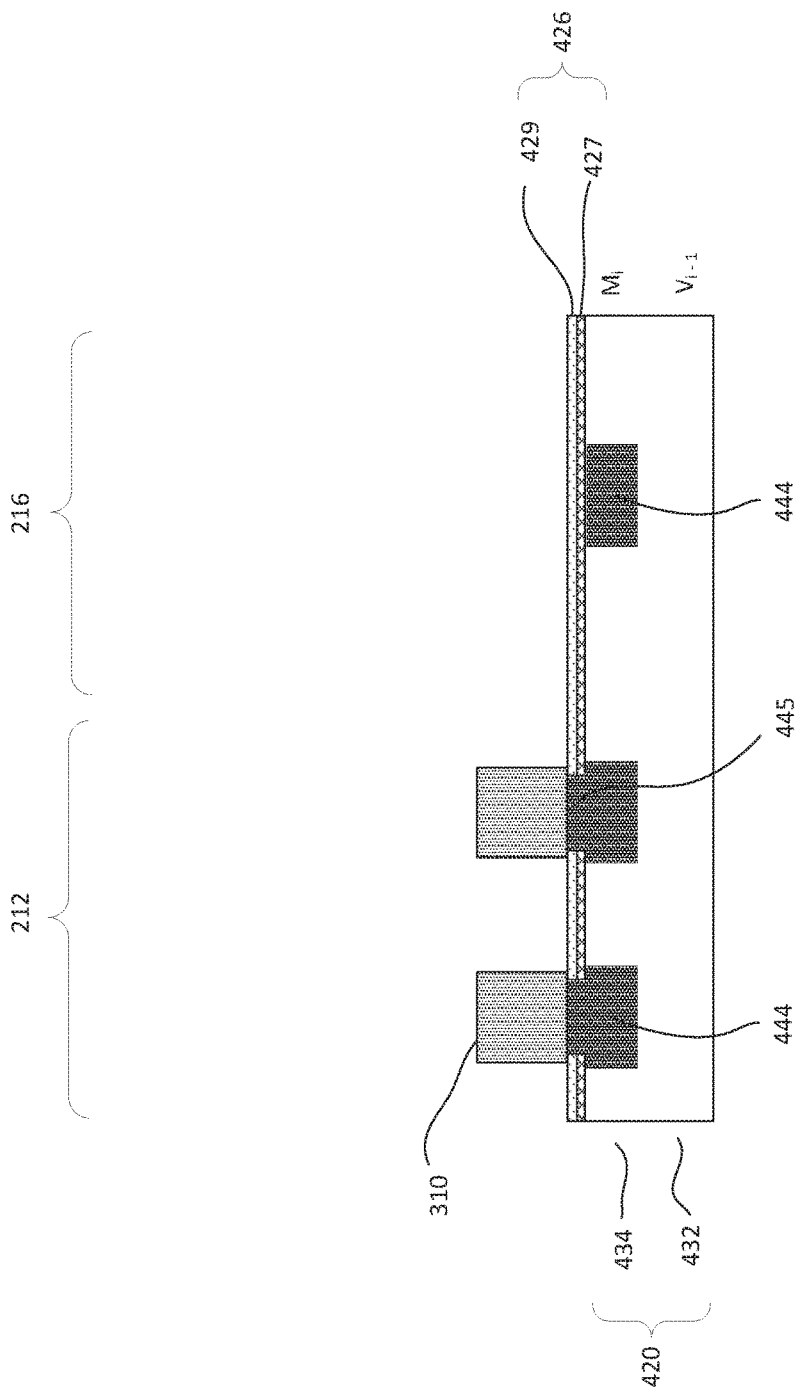

Referring to FIG. 6a, the process is at the same stage as that described in FIG. 5d. For example, BEOL processing forms storage units 310 of memory cells in the memory region 212 of an ILD level 420. The ILD level 420 includes a via level 432 disposed below a metal level 434. A lower cell via level 426 is formed between the ILD level 420 and the storage units 310. The storage units, for example, are magnetoresistive storage units of MRAM cells.

Figure 6B:
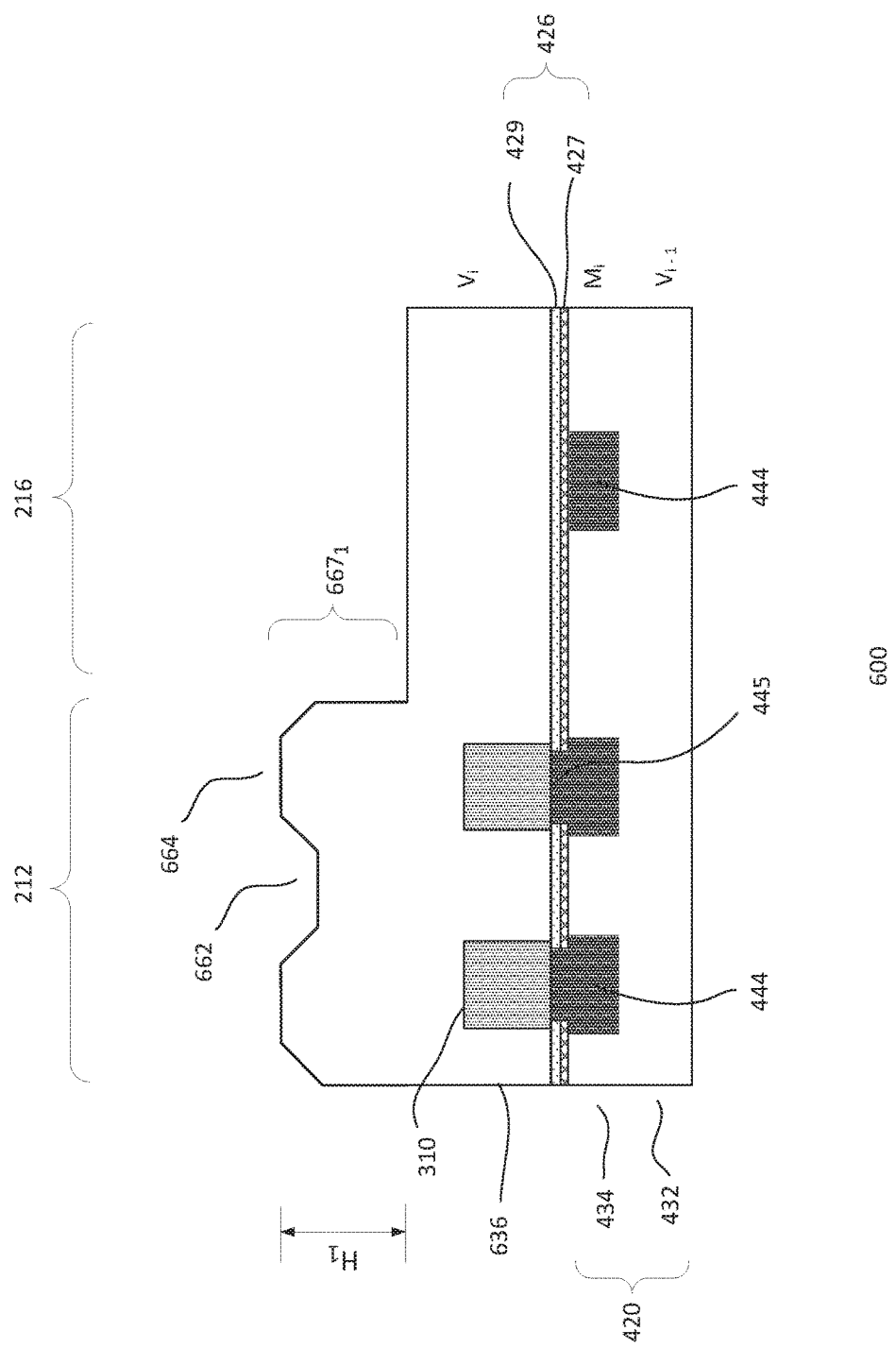

Referring to FIG. 6b, the process continues to form an upper cell via level over the lower cell via level 426. The upper cell via level may be same as or similar to that shown in FIG. 4. For example, a cell dielectric layer is formed over the lower cell via level 426 to cover the memory cells. The process to form the upper cell via level may include a deposition process. In one embodiment, the process to form the upper cell via level includes first and second deposition processes. The first deposition process, for example, forms a first cell dielectric layer 636 extending over the first and second regions 212 and 216. The first cell dielectric layer, in one embodiment, is a silicon oxide based material. For example, the first cell dielectric layer is a TEOS layer. Other types of dielectric material may also be useful. In one embodiment, a dry deposition technique is employed to form the upper cell via level. The first cell dielectric layer is formed by, for example, CVD. Other techniques for forming the first cell dielectric layer may also be useful. For example, the specific process may depend on the dielectric material used.

The first cell dielectric layer 636 is formed over the storage units 310 and sufficiently covers the storage units in the memory region taking into account of subsequent processing. Due to the underlying topography created by the presence of the storage units 310, the first cell dielectric layer 636 as deposited includes an irregular (or asymmetrical) surface topography. For example, the first cell dielectric layer includes a substantially planar top surface portion extending over the non-memory region 216 and a non-planar elevated top surface portion extending over the memory region 212 due to the storage units 310. The step structure $667_1$ may define the non-planar elevated surface portion of the first cell dielectric layer. The storage units, as discussed, may be separated by different dimensions of spacing or gaps. The first cell dielectric layer, in one embodiment, is conformally formed over the storage units 310 to result in a surface topography that corresponds to the dimension of the storage units 310 and the gaps. This may result in the step structure $667_1$ having one or more trench regions 662 and mesa regions 664. The trench regions 662, for example, correspond to the gaps between the storage units 310. It is understood that the first cell dielectric may also include other surface topography profiles depending on the underlying topography.

In one embodiment, the step structure $667_1$ includes a step height $H_1$ that extends from the base to the top of the mesa regions 664. The base of the step structure is, for example, defined by the substantially planar surface portion of the first cell dielectric layer in the non-memory region 216. The step height $H_1$, for example, extends about 100-300 nm upwardly from base of the step structure. Other step heights may also be useful depending on design requirements. The trench regions 662 may include different dimensions corresponding to different spacing and gaps. The first cell dielectric layer may include a thickness sufficient to fill the gaps between the storage units 310. In one embodiment, the first cell dielectric layer is sufficiently thick to form trench regions above the storage units 310. A thickness of the first cell dielectric layer is, for example, about 200-400 nm. Other thicknesses may also be useful.

Figure 6C:
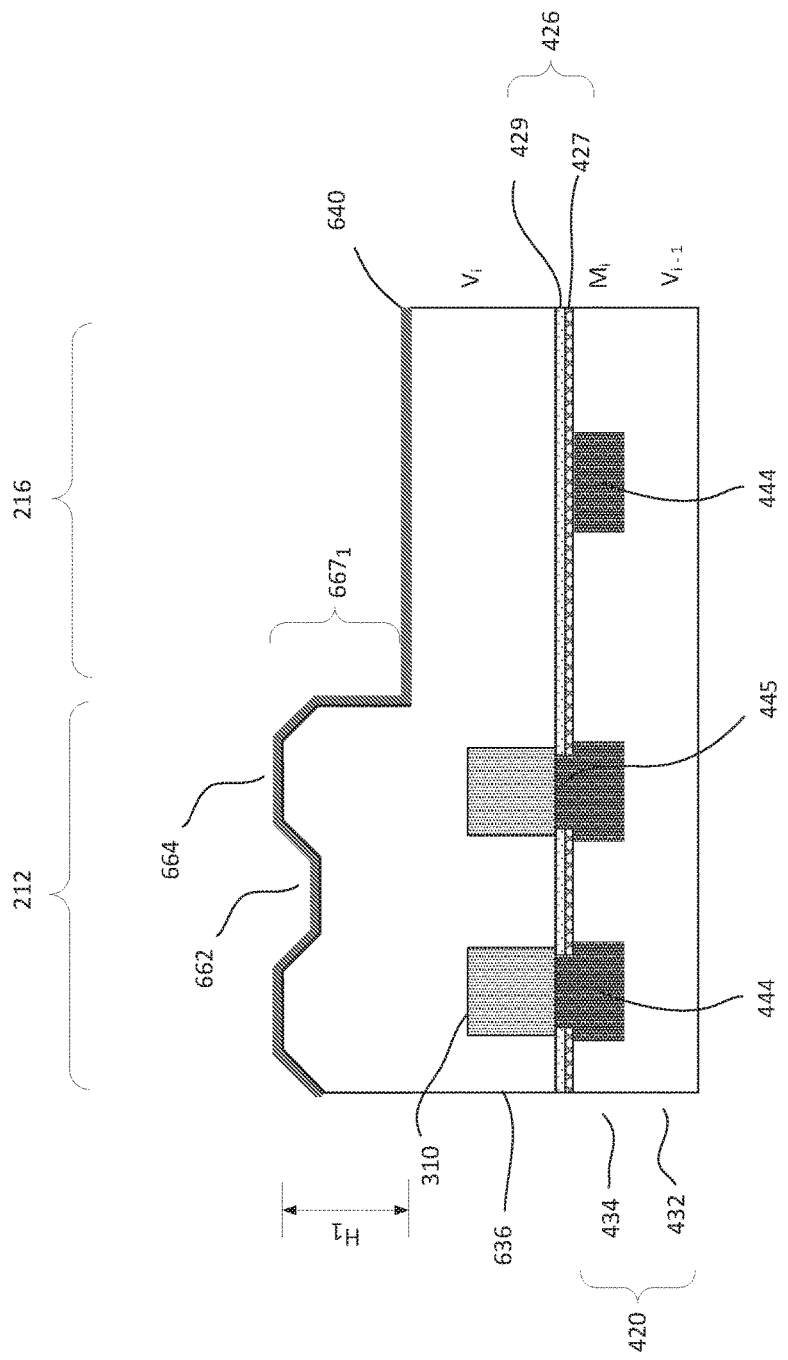

Referring to FIG. 6c, a polishing stop layer 640 is deposited on the first cell dielectric layer 636. The polishing stop layer includes first and second major surfaces. The first major surface may be the top surface and the second major surface may be the bottom surface. As shown, the first major surface of the polishing stop layer includes a surface topology similar to that of the first cell dielectric layer. The polishing stop layer, for example, conformally lines the asymmetrical top surface of the first cell dielectric layer 636 and extends across the memory and non-memory regions 212 and 216. For example, the polishing stop layer includes a planar portion overlapping the non-memory region 216 and an irregular (or non-planar) portion overlapping the memory region 212 of the first cell dielectric layer.

The polishing stop layer may be a thin dielectric layer. In one embodiment, the polishing stop layer lines the trench regions 662 of the step structure $667_1$ without filling the trench regions. For example, a thickness of the polishing stop layer is about 300-1000 Å. Other thicknesses may also be useful. The thin dielectric layer may be a dielectric stack. In one embodiment, a dielectric bilayer (not shown) forms the polishing stop layer. For example, forming the polishing stop layer 640 includes forming a lower (or first) stopping layer on the first cell dielectric layer 636 and forming an upper (or second) stopping layer on the lower stopping layer. In one embodiment, the first and second stopping layers include different dielectric materials. For example, the lower stopping layer includes a low-k dielectric such as NBLoK (SiCNH), while the upper stopping layer is silicon nitride. Other suitable dielectric material may also be useful. The polishing stop layer 640, in one embodiment, may be formed by a deposition process, such as CVD. For example, the first stopping layer is deposited over the substrate to cover the first cell dielectric layer and the second stopping layer is deposited to cover the first stopping layer. Other techniques may also be employed to form the polishing stop layer 640.

It is appreciated that the first and second stopping layers may include suitable thicknesses to define the final thickness of the polishing stop layer. Other configurations of the polishing stop layer may also be useful. For example, the polishing stop layer may be formed from one or more layers of suitable dielectric material to provide good polishing selectivity from the first cell dielectric layer 636.

Figure 6D:
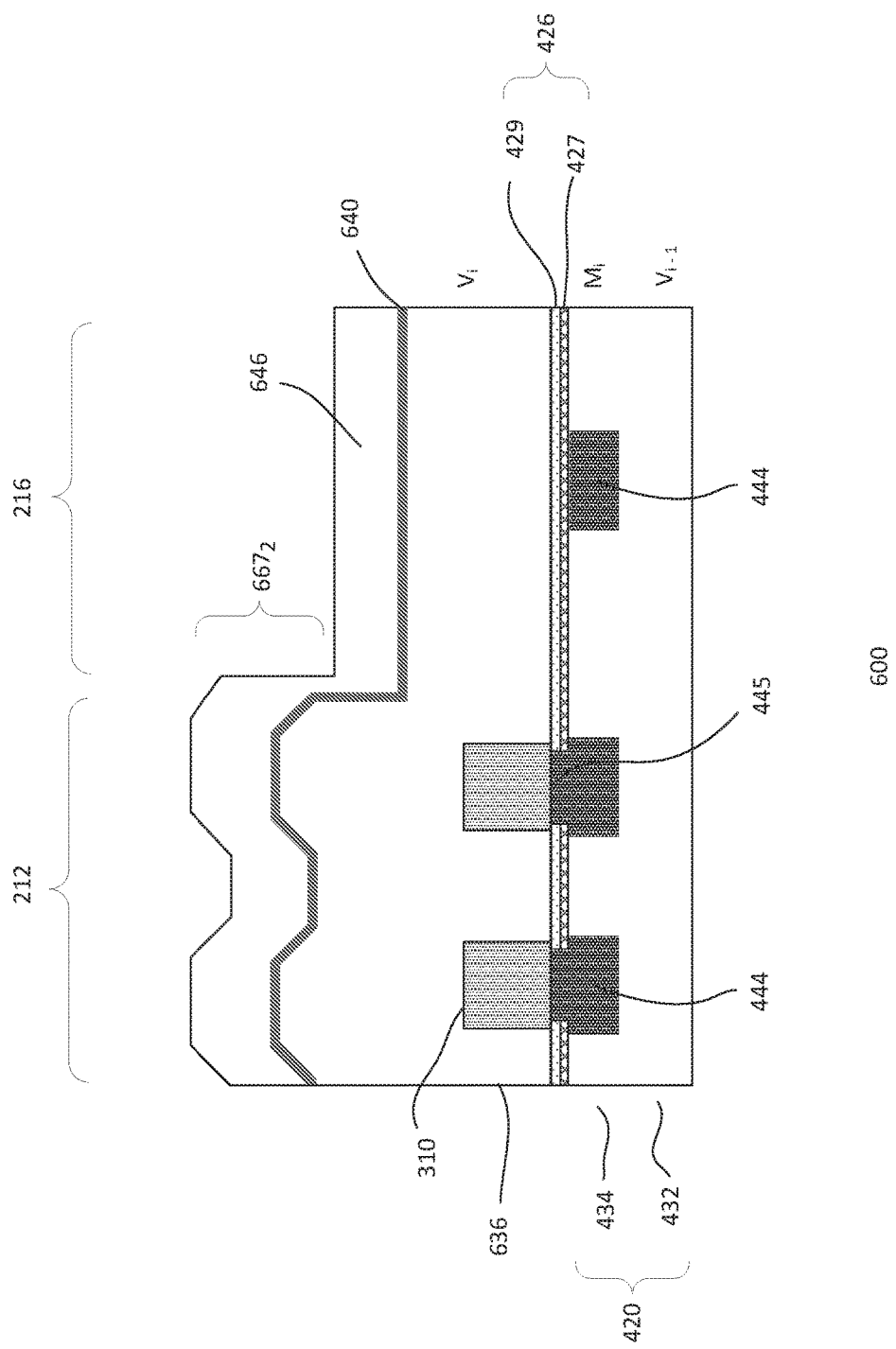

Referring to FIG. 6d, a second cell dielectric layer 646 is deposited on the polishing stop layer 640. For example, a second deposition process forms the second cell dielectric layer 646. The second deposition process may be similar to the first deposition process as described in FIG. 6b. For example, a CVD process deposits the same dielectric material as the first cell dielectric layer 636 to form the second cell dielectric layer 646. The second cell dielectric layer is, for example, a TEOS layer. Other techniques for forming the second cell dielectric layer may also be employed. As shown, the second cell dielectric layer 646 is conformally formed over the first dielectric layer 636 and polishing stop layer 640. Due to the underlying surface topography, the second cell dielectric layer includes an irregular surface topography similar to that of the first cell dielectric layer 636. The second cell dielectric layer, for example, includes a substantially planar top surface portion extending over the non-memory region 216 and a non-planar elevated top surface portion extending over the memory region 212. For example, the non-planar elevated top surface portion of the second cell dielectric layer 646 is defined by the step structure $667_2$. The second cell dielectric layer 646 includes a sufficient thickness to fill the underlying trench regions 662. In one embodiment, the second cell dielectric layer 646 includes a sufficient thickness to form the step structure $667_2$ with a step height similar to $H_1$. The height of step structure 6672 is, for example, about 100-300 nm. Other step height or dielectric thicknesses may also be useful, depending on design requirement.

Figure 6E:
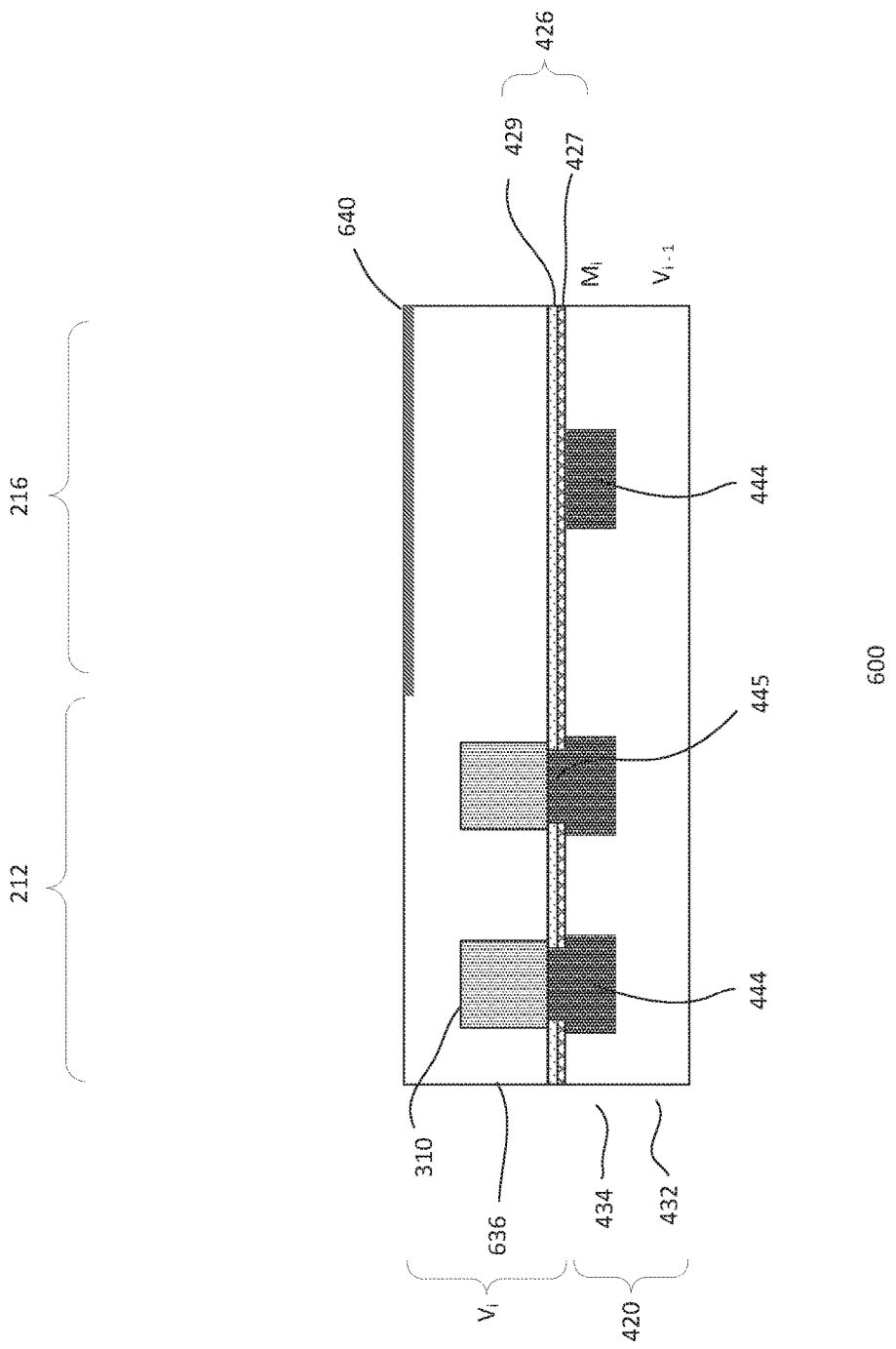

Referring to FIG. 6e, the process to form the upper cell via level continues by processing the substrate to form a planar substrate top surface. For example, a planarization technique is employed to form a planar BEOL dielectric surface over the substrate. Planarizing the BEOL dielectric layer, in one embodiment, includes polishing the first and second cell dielectric layers to remove excess dielectric materials. For example, chemical mechanical polishing (CMP) may be performed to form an upper cell via level having a planar top surface. Other planarization techniques may also be useful. In one embodiment, the CMP process includes suitable process parameters to selectively remove the step structure $667_1$ in the memory region 212 of the first cell dielectric layer 636 without removing surface material from the non-memory region 216 of the first cell dielectric layer. For example, the CMP process completely removes the second cell dielectric layer 646. The CMP process may include first and second phases. For example, different chemical slurry is employed during the different phases of the CMP process. In one embodiment, the CMP process employs a highly selective chemical slurry in the first phase to facilitate forming a coplanar top surface between the first cell dielectric layer 636 and the planar portion of the polishing stop layer 640 in the non-memory region 216. For example, the high selectivity chemical slurry includes a selectivity ratio of 10:1 for IEOS:SiN/NBLOK. Other selectivity ratio may also be useful. The first phase of the CMP process simultaneously removes the second cell dielectric layer 646, the polishing stop layer 640 in the memory region 212, and elevated portions of the first cell dielectric layer 636 that define the step structure $667i$. In one embodiment, the first phase of the CMP process stops on the substantially planar top surface of the polishing stop layer 640 overlapping the non-memory region 216. For example, the planar portion of the polishing stop layer serves as an end-point of the first phase. This results in a coplanar top surface between the remaining elevated portion of the first cell dielectric layer and the planar portion of the polishing stop layer.

Referring to FIG. 6f, a second phase of the CMP process is performed. For example, the second phase continues to remove the remaining elevated portion of the first cell dielectric layer and the remaining polishing stop layer 640 to planarize the first cell dielectric layer 636 and define an upper cell via level 436. The upper cell via level 436 and lower cell via level 426 collectively form the cell via level. The cell via level, for example, may be the via level of the i+1 ILD level. For example, the cell via level is $V_i$ level of the i+1 ILD level.

In one embodiment, the second phase of the CMP process employs a neutral or non-selective chemical slurry to facilitate removing the remaining polishing stop layer 640 and forming a completely planar top surface of the cell dielectric layer 436. For example, the second phase removes the dielectric materials of the polishing stop layer 640 in the non-memory region and the exposed portion of the first cell dielectric layer 636 in the memory region at about the same removal rate. The resulting cell dielectric layer 436, for example, includes a planar top surface 439 (or $439_A$) extending over the substrate and across the memory and non-memory regions 212 and 216. Depending on the design requirements or integration scheme of the CMP process, the planar top surface 439 may be positioned above the top of the storage units 310, or coplanar to the top surface of the storage units 310. The second phase of the CMP process, for example, leaves a cell dielectric thickness of about 0-1000 Å above the top surface of the storage units. Providing other cell dielectric configurations may also be useful. The second phase of the CMP process also serves to remove or reduce surface defects, such as scratches and pits.

Additional processes may be performed to complete the formation of the device. For example, a metal level (not shown) may be disposed over $V_i$. For example, $M_{i+1}$ may be disposed over $V_i$. Depending on i, additional ILD levels as well as UTM level and passivation layer may be provided over $M_{i+1}$. Over device layers may also be provided. After BEOL processing is completed, the wafer may be diced to singulate the devices for packaging. In one embodiment, wire bonding may be performed on the devices and the devices are being packaged. In other embodiments, wafer level packaging may be performed. For example, wafer level packaging is performed followed by dicing the wafer to singulate the devices. Other processes may also be performed.

The embodiment as described in FIGS. 6a-6f results in various advantages. As described, the process 600 includes forming a polishing stop layer 640 over the memory and non-memory regions of the first cell dielectric layer 636. The irregular portion of the polishing stop layer (e.g., portion overlapping the memory region 212) is easily removed in the first phase of the CMP process, as compared to the planar portion of the polishing stop layer (e.g., portion overlapping the non-memory region 216), due to the irregular surface topology. The planar portion of the polishing stop layer 640 provides a protective layer over the non-memory region 216 to prevent over-polishing. This improves end-point control of a global or integrated CMP process performed on a BEOL dielectric layer having different types of device regions. Furthermore, employing a high-selectivity chemical slurry in the first phase of the CMP process significantly improves the uniformity between the resulting coplanar top surfaces of the polishing stop layer 640 and the first cell dielectric layer 636.

Figure 7A:
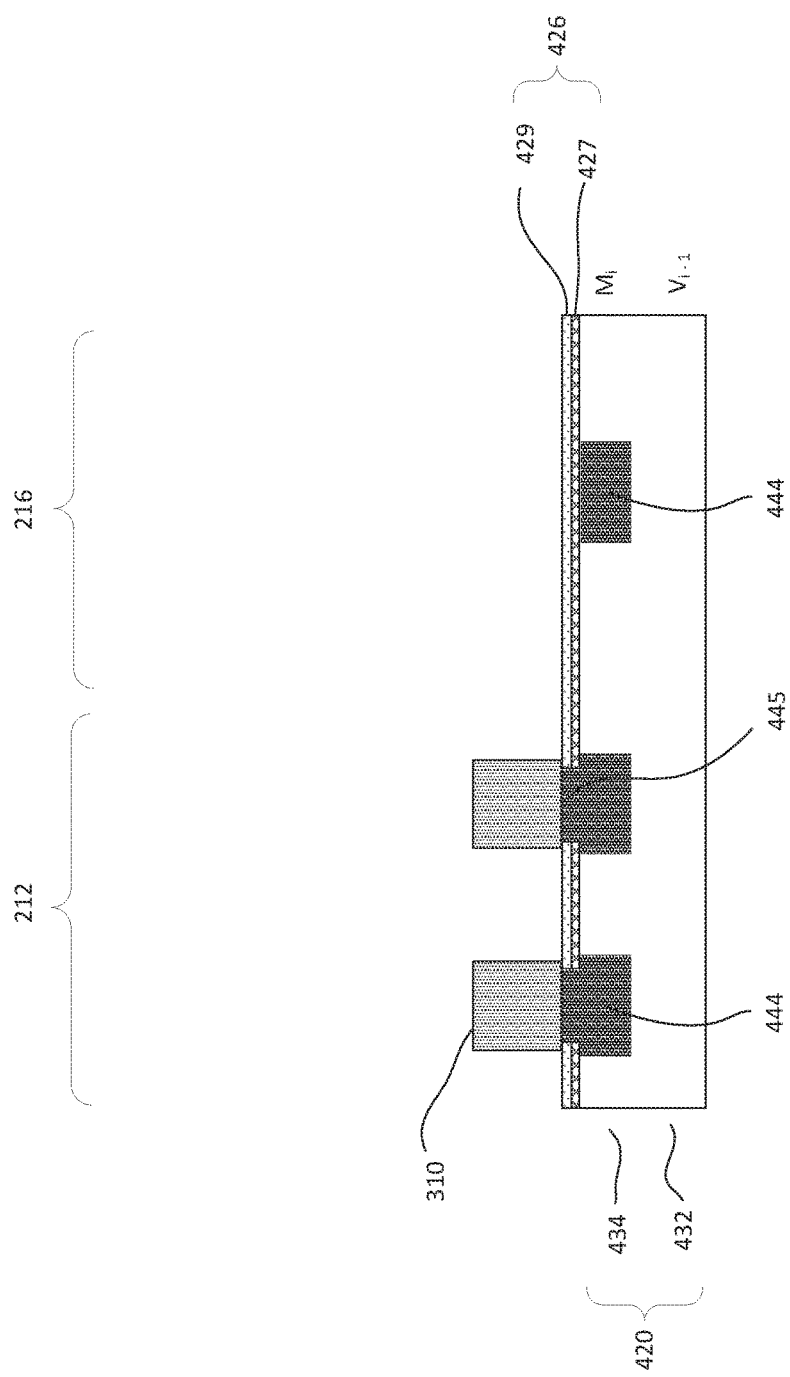
Figure 7B:
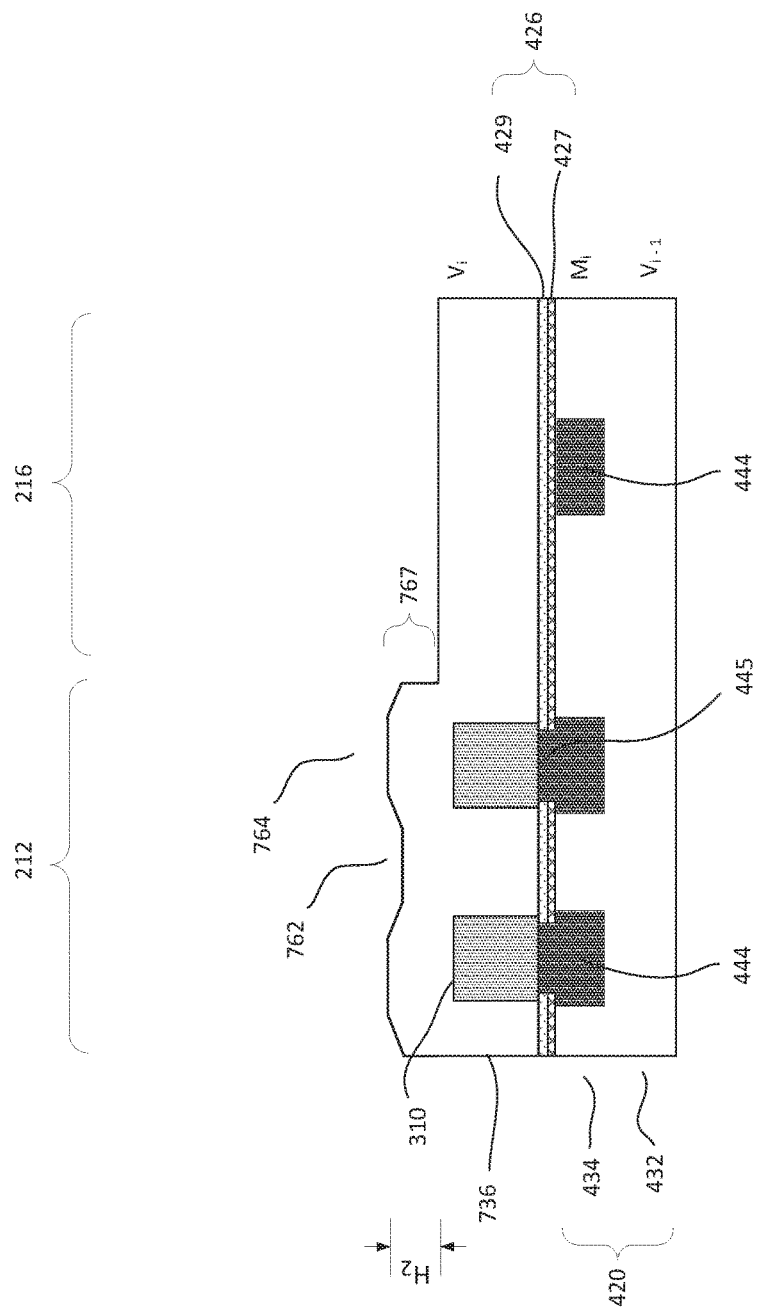

FIGS. 7a-7c show cross-sectional views of another embodiment of a process 700 for forming a device. The process 700 relates to forming an ILD level of a device. The device may be similar to that described in FIG. 4. For example, the process 700 relates to forming an upper cell via level 436, as shown in FIG. 4. In the interest of brevity, common elements may not be described or described in detail. The device, for example, includes a substrate (not shown) which includes FEOL components. The device includes memory and non-memory regions 212 and 216. For example, the memory region 212 includes embedded memory cells and the non-memory region 216 includes logic devices. BEOL processing is performed after forming FEOL components on the substrate. The BEOL processing may include processes same as or similar to the process 500 as described in FIGS. 5a-5d. The BEOL processing, for example, includes processes to form interconnects and memory cells in ILD levels.

Referring to FIG. 7a, the process is at the same stage as that described in FIG. 5d. For example, BEOL processing forms storage units 310 of memory cells over an ILD level 420 and in the memory region 212. The ILD level 420 includes a via level 432 disposed below a metal level 434. A lower cell via level 426 is formed between the ILD level 420 and the storage units 310. The storage units, for example, are magnetoresistive storage units of MRAM cells.

Referring to FIG. 7b, the process continues to form an upper cell via level over the lower cell via level 426. The upper cell via level may be same as or similar to that shown in FIG. 4. For example, a cell dielectric layer is formed over the lower cell via level 426 to cover the memory cells. The process to form the upper cell via level may include a deposition process. In one embodiment, a wet deposition technique (or sol-gel technique) is employed to form the upper cell via level. For example, a liquid, silica-based dielectric film may be formed over the substrate by spinning, dipping, draining or spraying. A film curing process may be performed to solidify the dielectric film and form the cell dielectric layer 736. In one embodiment, a spin-on glass (SOG) deposition technique is employed to spin-coat a SOG layer (or dielectric film) over the lower cell via level 426. The SOG layer is, for example, cured at a temperature less than 500° C. to form the cell dielectric layer 736. Other suitable curing temperatures may also be useful. The cell dielectric layer may include any suitable dielectric materials, such as silicate, siloxane, or other materials having similar chemical property, while the solvent to dissolve the dielectric material may include alcohol, ketone or other solvent having similar chemical property. Other wet deposition techniques for forming the cell dielectric layer 736 may also be useful.

The cell dielectric layer 736 is formed over the storage units 310 and sufficiently covers the storage units in the memory region taking into account of subsequent processing. Due to the underlying topography created by the presence of the storage units 310, the cell dielectric layer 736 as deposited includes an asymmetrical surface topography similar to that described in FIG. 6b. For example, the cell dielectric layer includes a substantially planar top surface portion extending over the non-memory region 216 and a non-planar elevated top surface portion extending over the memory region 212 due to the storage units 310. The step structure 767 defines the non-planar elevated surface portion of the cell dielectric layer 736 and includes one or more trench regions 762 and mesa regions 764.

In one embodiment, the step structure 767 differs from the step structure $667_1$ of FIG. 6b in that the step structure 767 includes a step height $H_2$ which is much lower than $H_1$. The step height $H_2$, for example, extends about 10-100 nm upwardly from the base to the top of the mesa regions 764. Other step heights may also be useful depending on design requirements. The base of the step structure may be defined by the substantially planar surface portion of the cell dielectric layer 736 in the non-memory region 216. The trench regions 762 may include different dimensions corresponding to different spacing and gaps. The cell dielectric layer may include a thickness sufficient to fill the gaps between the storage units 310. In one embodiment, the cell dielectric layer is sufficiently thick to form trench regions above the storage units 310. A thickness of the first cell dielectric layer is, for example, about 100-300 nm. Other thicknesses may also be useful.

Referring to FIG. 7c, the process to form the upper cell via level continues by processing the substrate to form a planar substrate top surface. For example, a planarization technique is employed to form a planar BEOL dielectric surface over the substrate. Planarizing the BEOL dielectric layer, in one embodiment, includes polishing the cell dielectric layer 736 to remove excess dielectric materials. For example, chemical mechanical polishing (CMP) may be employed to planarize the top surface of the cell dielectric layer 736. Other planarizing techniques may also be useful. The planarized cell dielectric layer 736 defines an upper cell via level of a device similar to that described in FIG. 4 and FIG. 6f. For example, the upper cell via level 736 and lower cell via level 426 collectively form a cell via level. The cell via level may be the via level of the i+1 ILD level. For example, the cell via level is $V_i$ level of the i+1 ILD level.

The cell dielectric layer 736 is planarized to form a completely planar top surface 739 extending across the memory and non-memory regions 212 and 216. In one embodiment, the cell dielectric layer 736 is processed to form a planar top surface 739 that is above the top of the storage units 310. Alternatively, the cell dielectric layer 736 may be processed to form a planar top surface 739A that is coplanar to the top of the storage units 310. For example, the cell dielectric layer 736 may be planarized to form a dielectric thickness of about 0-1000 Å over the top of the storage units, depending on the design requirements or integration scheme of the CMP process.

Additional processes may be performed to complete the formation of the device. For example, a metal level (not shown) may be disposed over $V_i$. For example, $M_{i+1}$ may be disposed over $V_i$. Depending on i, additional ILD levels as well as UTM level and passivation layer may be provided over $M_{i+1}$. Over device layers may also be provided. After BEOL processing is completed, the wafer may be diced to singulate the devices for packaging. In one embodiment, wire bonding may be performed on the devices and the devices are being packaged. In other embodiments, wafer level packaging may be performed. For example, wafer level packaging is performed followed by dicing the wafer to singulate the devices. Other processes may also be performed.

The embodiment as described in FIGS. 7a-7c results in various advantages. As described, the process 700 employs a wet deposition technique to form the cell dielectric layer 736. Wet deposition techniques, such as SOG technique include a self-planarizing process to provide superior planarizing and gap fill characteristics as compared to dry deposition techniques such as CVD. In the case of SOG technique, a solvent containing dielectric material is evenly spin coated on the substrate and easily fills the gaps between storage units 310. This advantageously results in a shorter step structure 767 prior to planarization, as described in FIG. 7b. For example, having a smaller step height greatly improves control of a global or integrated CMP process to reliably form an upper cell level with a planar top surface extending across different device regions.

Although an SOG technique is illustrated in the process 700, it is appreciated that other wet deposition techniques with superior planarizing and gap fill characteristics may also be employed to form a cell dielectric layer having a smaller step structure.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method of forming a device comprising:
providing a substrate comprising a circuit component formed on a substrate surface;
performing back-end-of-line (BEOL) processing to form a plurality of inter-level dielectric (ILD) levels over the substrate, wherein the plurality of ILD levels comprises an $x^{th}$ ILD level, wherein the $x^{th}$ ILD level includes a contact level $V_x$ disposed between metal level $M_x$ and $M_{x+1}$, wherein the contact level $V_x$ includes a lower dielectric layer extending across a memory region and a non-memory region of the contact level $V_x$;

forming a storage unit of a memory cell, wherein the storage unit is disposed in the memory region of the contact level $V_x$ and on the lower dielectric layer of the contact level V;

forming an cell dielectric layer over the lower dielectric layer of the contact level $V_x$, wherein the cell dielectric layer covers the storage unit and extends across the memory region and the non-memory region of the contact level $V_x$, wherein the cell dielectric layer comprises an irregular surface topography having a step structure created by an elevated topography of the memory region relative to the non-memory region of the contact level $V_x$, wherein the elevated topography is defined by the storage unit of the contact level $V_x$;

forming a polishing stop layer over the cell dielectric layer, wherein the polishing stop layer conformally lines the irregular surface topography of the cell dielectric layer and extends across the memory and non-memory regions of the contact level $V_x$;

performing a chemical mechanical polishing (CMP) process comprising a first and a second phase, wherein the first phase CMP process removes the step structure of the cell dielectric layer and a portion of the polishing stop layer in the memory region, and forms a coplanar top surface between a topmost planar surface of the cell dielectric layer remaining in the memory region and a top planar surface of the polishing stop layer remaining in the non-memory region; and wherein the second phase CMP process removes a material of the polishing stop layer and a material of the cell dielectric layer at about a same removal rate to form a final planar top surface of the cell dielectric layer.

2. The method of claim 1 wherein the storage unit comprises a magnetic tunnel junction of a magnetoresisitve memory cell.

3. The method of claim 1 wherein the cell dielectric layer comprise tetraethyl orthosilicate (TEOS).

4. The method of claim 1 further comprising forming a second cell dielectric layer over the polishing stop layer prior to performing the first phase CMP process, wherein the first phase CMP process completely removes the second cell dielectric layer.

5. The method of claim 1 wherein the top planar surface of the polishing stop layer in the non-memory region serves as an end-point of the first phase CMP process.

6. The method of claim 5 wherein the polishing stop layer comprises a silicon nitride layer disposed on a SiCNH layer.

7. The method of claim 1 wherein the second phase CMP process is performed after the first phase CMP process, and the second phase CMP process employs a neutral chemical slurry to completely remove the polishing stop layer remaining in the non-memory region while simultaneously removing an exposed top portion of the cell dielectric layer in the memory region.

8. The method of claim 7 wherein the first phase CMP process employs a selective chemical slurry to remove the material of the cell dielectric layer at a higher removal rate than the material of the polishing stop layer.

9. The method of claim 1 wherein the final planar top surface of the cell dielectric layer corresponds to a top surface of the contact level $V_x$, and the storage unit is disposed completely within the contact level $V_x$.

10. The method of claim 9 wherein the metal level $M_{x+1}$ is positioned over the storage unit and the contact level $V_x$.

11. The method of claim 1 wherein a top portion of the cell dielectric layer directly separates a top of the storage unit and the final planar top surface of the cell dielectric layer.

12. The method of claim 1 wherein the cell dielectric layer comprises a substantially planar top surface extending across the non-memory region of the contact level $V_x$.

13. A method of forming a device comprising:
providing a substrate comprising a circuit component formed on a substrate surface;

performing back-end-of-line (BEOL) processing to form a BEOL dielectric stack over the substrate, wherein the BEOL dielectric stack comprises a via level defined with a memory region and a non-memory region, wherein the via level includes a lower dielectric layer extending across the memory and non-memory regions of the via level;

forming a storage unit of a memory cell, wherein the storage unit is disposed in the memory region of the via level and on the lower dielectric layer of the via level;

forming a dielectric layer over the lower dielectric layer of the via level, wherein the dielectric layer covers the storage unit and extends across the memory region and the non-memory region of the via level, wherein the dielectric layer comprises an irregular surface topography having a step structure created by an elevated topography of the memory region relative to the non-memory region of the via level, wherein the elevated topography is defined by the storage unit of the via level;

forming a polishing stop layer over the dielectric layer, wherein the polishing stop layer conformally lines the irregular surface topography of the dielectric layer and extends across the memory and non-memory regions of the via level;

performing a chemical mechanical polishing (CMP) process comprising a first and a second phase, wherein the first phase CMP process removes the step structure of the dielectric layer and a portion of the polishing stop layer in the memory region, and forms a coplanar top surface between a topmost planar surface of the dielectric layer remaining in the memory region and a top planar surface of the polishing stop layer remaining in the non-memory region; and wherein the top planar surface of the polishing stop layer in the non-memory region serves as an end-point of the first phase CMP process.

14. The method of claim 13 further comprising forming a second dielectric layer over the polishing stop layer prior to performing the first phase CMP process, wherein the first phase CMP process completely removes the second dielectric layer.

15. The method of claim 13 wherein the polishing stop layer comprises a silicon nitride layer disposed on a SiCNH layer.

16. The method of claim 13 wherein the first phase CMP process employs a selective chemical slurry to remove a material of the dielectric layer at a higher removal rate than a material of the polishing stop layer.

17. The method of claim 13 wherein the second phase CMP process removes the polishing stop layer in the non-memory region and a top portion of the dielectric layer in the memory region at about a same removal rate to form a final planar top surface of the dielectric layer.

18. The method of claim 17 wherein the second phase CMP process is performed after the first phase CMP process, and employs a neutral chemical slurry to completely remove the polishing stop layer while simultaneously removing the top portion of the dielectric layer, wherein a material of the dielectric layer is different from a material of the polishing stop layer.

19. A device comprising:
- a substrate having a circuit component disposed on a substrate surface;
- a back-end-of-line (BEOL) dielectric stack disposed on the substrate surface and over the circuit component, wherein the BEOL dielectric stack comprises an inter-level dielectric (ILD) level, wherein the ILD level includes a via level defined with a memory region and a logic region, wherein the via level includes a lower via dielectric and an upper via dielectric extending across the memory region and the logic region;
- a storage unit of a memory cell is disposed in the memory region of the via level and on the lower via dielectric, wherein the upper via dielectric is a single and distinct dielectric layer which covers first and second sides of the storage unit, wherein no metal structure is disposed in the logic region of the upper via dielectric, and the upper via dielectric comprises a chemical mechanical polished top surface, wherein the chemical mechanical polished top surface extends uniformly throughout the upper via dielectric; and

- wherein the chemical mechanical polished top surface of the upper via dielectric corresponds to a planar top surface of the via level.

20. The device of claim 19 wherein a top of the storage unit is below the planar top surface of the via level.

* * * * *

UNITED STATES PATENT AND TRADEMARK OFFICE
CERTIFICATE OF CORRECTION

PATENT NO. : 9,997,562 B1
APPLICATION NO. : 15/458944
DATED : June 12, 2018
INVENTOR(S) : Lei Wang et al.

It is certified that error appears in the above-identified patent and that said Letters Patent is hereby corrected as shown below:

In the Specification

Column 7
Line 12, replace "6x" with -- 6X --.
Line 13, replace "1x, 2x or 6x" with -- 1X, 2X or 6X --.

Column 14
Line 63, replace "6672" with -- $667_2$ --.
Line 66, replace "6672" with -- $667_2$ --.

Column 15
Line 1, replace "6672" with -- $667_2$ --.
Line 29, replace "IEOS" with -- TEOS --.
Line 34, replace "667i" with -- $667_1$ --.

Column 18
Line 9, replace "739A" with -- $739_A$ --.

Signed and Sealed this
Twenty-first Day of August, 2018

Andrei Iancu
*Director of the United States Patent and Trademark Office*